United States Patent
Janjua et al.

(10) Patent No.: US 10,707,751 B2
(45) Date of Patent: Jul. 7, 2020

(54) ELECTRONIC CIRCUIT INCLUDING CHARGE PUMP FOR CONVERTING VOLTAGE

(71) Applicant: SAMSUNG ELECTRONICS CO., LTD., Suwon-si, Gyeonggi-Do (KR)

(72) Inventors: Bilal Ahmad Janjua, Suwon-si (KR); Sungwhan Seo, Hwaseong-si (KR); Vivek Venkata Kalluru, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/550,191

(22) Filed: Aug. 24, 2019

(65) Prior Publication Data

US 2020/0144910 A1 May 7, 2020

(30) Foreign Application Priority Data

Nov. 5, 2018 (KR) ......................... 10-2018-0134745

(51) Int. Cl.
*H02M 3/07* (2006.01)
*G05F 3/02* (2006.01)
*G11C 5/14* (2006.01)

(52) U.S. Cl.
CPC ............... *H02M 3/07* (2013.01); *G11C 5/145* (2013.01)

(58) Field of Classification Search
CPC combination set(s) only.
See application file for complete search history.

(56) References Cited

U.S. PATENT DOCUMENTS

| 6,734,717 B2* | 5/2004 | Min | H02M 3/073 327/536 |
|---|---|---|---|
| 6,781,440 B2 | 8/2004 | Huang | |
| 7,113,023 B2 | 9/2006 | Cernea | |
| 7,760,010 B2 | 7/2010 | Gebara et al. | |
| 7,855,591 B2 | 12/2010 | Racape | |
| 8,125,263 B2* | 2/2012 | Wu | H02M 3/073 327/536 |

(Continued)

FOREIGN PATENT DOCUMENTS

JP 4877334 B2 2/2012

OTHER PUBLICATIONS

Shuhei Tanakamaru et al., 'A 0.5V Operation VTH Loss Compensated DRAM Word-line Booster Circuit for Ultra-Low Power VLSI System,' IEEE Journal of Solid-State Circuits, vol. 46, No. 10, Oct. 2011.

*Primary Examiner* — An T Luu
(74) *Attorney, Agent, or Firm* — Volentine, Whitt & Francos, PLLC

(57) ABSTRACT

An electronic circuit includes a first switch circuit, a second switch circuit, a pumping circuit, and a main charge pump. The first switch circuit transfers a first driving voltage to a first node based on a first clock. The second switch circuit transfers a second driving voltage to a second node based on the first driving voltage of the first node. The pumping circuit outputs a pumping voltage having a level corresponding to a sum of a level of the second driving voltage and a first operation level of a second clock, based on the second driving voltage of the second node and the first operation level. The main charge pump converts an input voltage based on the pumping voltage.

20 Claims, 17 Drawing Sheets

(56) References Cited

U.S. PATENT DOCUMENTS

| | | |
|---|---|---|
| 8,378,737 B2 | 2/2013 | Ker et al. |
| 8,421,524 B2 | 4/2013 | Pan et al. |
| 8,547,168 B2 * | 10/2013 | Kok .................. H02M 3/07 |
| | | 327/536 |
| 9,369,115 B2 | 6/2016 | Kalluru et al. |
| 2007/0109035 A1 | 5/2007 | Tsivyan |

* cited by examiner

FIG. 6
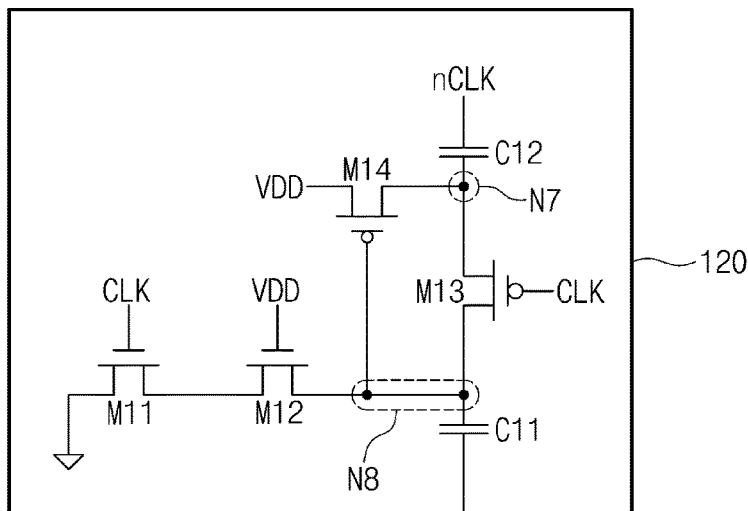
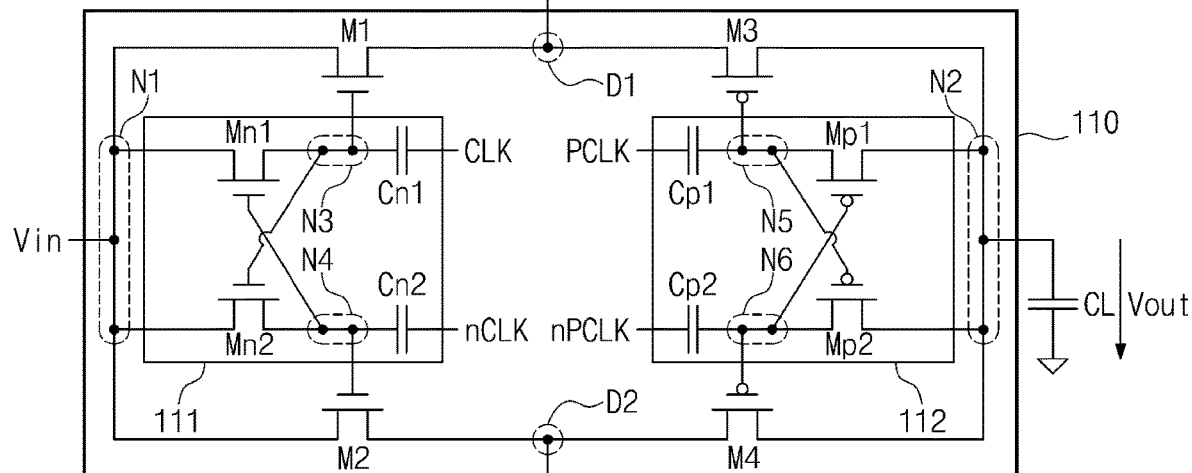
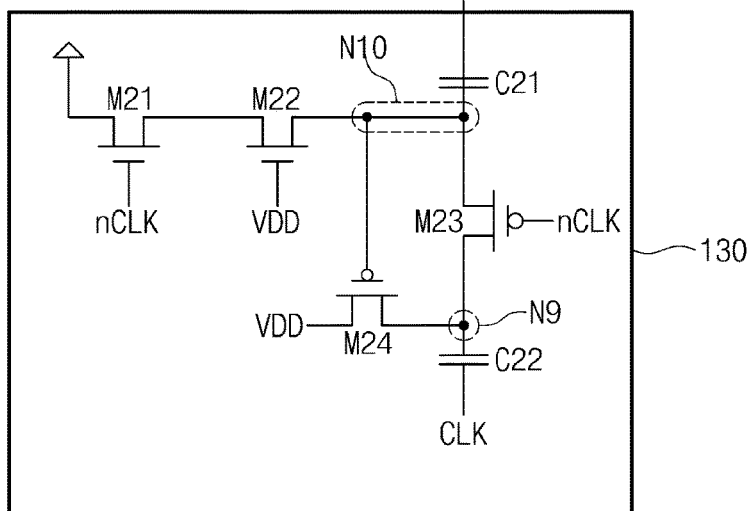

US 10,707,751 B2

ELECTRONIC CIRCUIT INCLUDING CHARGE PUMP FOR CONVERTING VOLTAGE

CROSS-REFERENCE TO RELATED APPLICATION

This application claims priority under 35 U.S.C. § 119 to Korean Patent Application No. 10-2018-0134745 filed on Nov. 5, 2018, in the Korean Intellectual Property Office, the disclosure of which is incorporated by reference herein in its entirety.

BACKGROUND

Embodiments of the disclosure described herein relate to an electronic circuit, and more particularly, relate to an electronic circuit for converting a voltage.

A semiconductor memory includes a volatile memory and a nonvolatile memory. The volatile memory loses data stored therein when power is turned off, and the nonvolatile memory retains data stored therein even though power is turned off. The nonvolatile memory is classified depending on a type of a memory cell transistor. For example, the nonvolatile memory is classified as a flash memory, a ferroelectric random-access memory (FRAM), a magnetic RAM (MRAM), or a phase change RAM (PRAM) depending on a type of a memory cell storing data.

Among the nonvolatile memories, the flash memory is classified as a NOR flash memory or a NAND flash memory depending on a connection relationship between a memory cell and a bit line. A memory cell array of the NOR flash memory includes a configuration in which two or more memory cells are connected in parallel to one bit line. A memory cell array of the NAND flash memory includes a configuration (or a cell string) in which two or more memory cells are connected in series to one bit line.

The flash memory may supply voltages having various levels to a memory cell for the purpose of storing data to the memory cell or reading the data stored in the memory cell. Accordingly, the flash memory may include an electronic circuit for generating various levels of voltages based on a received voltage. There is a demand on placing electronic circuits included in the flash memory in the small area as a semiconductor chip is highly integrated. Accordingly, a design for an electronic circuit for generating various levels of voltages while occupying the small area is required.

SUMMARY

Embodiments of the disclosure provide an electronic circuit including a charge pump for converting a voltage.

According to an exemplary embodiment, an electronic circuit may include a first switch circuit, a second switch circuit, a pumping circuit, and a main charge pump. The first switch circuit may transfer a first driving voltage to a first node based on a first clock. The second switch circuit may transfer a second driving voltage to a second node based on the first driving voltage of the first node. The pumping circuit may output a pumping voltage having a level corresponding to a sum of a level of the second driving voltage and a first operation level of a second clock, based on the second driving voltage of the second node and the first operation level. The main charge pump may convert an input voltage based on the pumping voltage.

According to another exemplary embodiment, an electronic circuit includes a first charge pump that transfers a first voltage to a first node in response to a first transition of a first clock signal. A second charge pump transfers a second voltage to the first node in response to a second transition of the first clock signal, which second transition is opposite to the first transition. The first charge pump outputs a sum of the first voltage and the second voltage from the first node to a load in response to a third transition of a second clock signal.

BRIEF DESCRIPTION OF THE FIGURES

The above and other objects and features of the disclosure will become apparent by describing in detail exemplary embodiments thereof with reference to the accompanying drawings.

FIG. 6 is a circuit diagram illustrating exemplary configurations of switch circuits and a charge pumping circuit of FIG. 5.

DETAILED DESCRIPTION

Below, embodiments of the disclosure may be described in detail and clearly to such an extent that an ordinary one in the art easily implements the disclosure.

For better understanding, in the specification, a level of a voltage may be expressed by using a symbol of the voltage. For example, in the case where a symbol of a particular voltage is "Va", a level of a voltage Va may be expressed by "Va".

In the specification, "turn-on" of a switch means that opposite ends of the switch are connected and a current and a voltage are transferred through the switch. In the specification, "turn-off" of a switch means that opposite ends of the switch are disconnected and a current and a voltage are not transferred through the switch.

In the specification, the expression "a voltage is transferred by a capacitive element" is used. The expression "a voltage is transferred by a capacitive element" means that charges are accumulated at a first end of the capacitive element by a voltage input to the first end, charges (e.g., charges having a sign which is opposite to a sign of the charges accumulated at the first end) are accumulated at a second end of the capacitive element by the charges accumulated at the first end, and a voltage corresponding to the voltage input to the first end is formed at a node between the second end and another element connected to the second end as a potential difference is formed between a node the first end and the second end of the capacitive element by the accumulated charges.

In the specification, the expression "a voltage is maintained by a capacitive element" is used. The expression "a voltage is maintained by a capacitive element" means that charges are accumulated at a first end of the capacitive element by a voltage input to the first end, charges (e.g., charges having a sign which is opposite to a sign of the charges accumulated at the first end) are accumulated at a second end of the capacitive element by the charges accumulated at the first end, a voltage corresponding to the voltage of the first end is formed at the second end as a potential difference is formed between the first end and the second end by the accumulated charges, energy corresponding to the potential difference between the first end and the second end is charged to the capacitive element, and a level of the voltage of the first end and a level of the voltage of the second end are maintained as the energy charged by the capacitive element is maintained.

In the specification, a component expressed as a switch may be implemented with various types of transistors or a combination thereof. For example, a switch may be implemented with at least one of a bipolar junction transistor (BJT) or a field effect transistor (FET), or a combination thereof.

Figure 1:
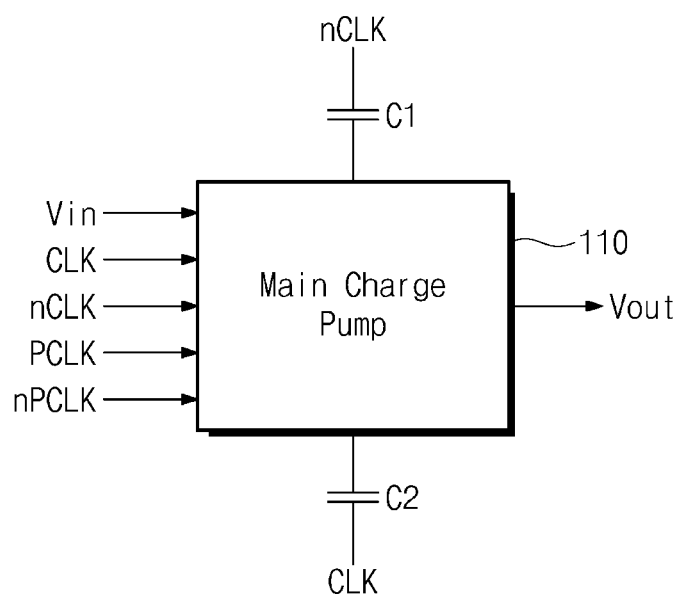
FIG. 1 is a block diagram illustrating an exemplary charge pump.

FIG. 1 is a block diagram illustrating an exemplary charge pump.

Referring to FIG. 1, a charge pump 100a may include a main charge pump 110 and capacitive elements C1 and C2.

For example, the charge pump 100a may receive a voltage VDD and a voltage Vin from an external electronic circuit of the charge pump 100a. For example, the charge pump 100a may receive the voltage VDD and the voltage Vin from a voltage generator or a voltage regulator. The charge pump 100a may receive various clocks from an external electronic circuit of the charge pump 100a. For example, the charge pump 100a may receive clocks CLK, nCLK, PCLK, and nPCLK from a clock generator.

The clocks CLK, nCLK, PCLK, and nPCLK may have two levels sequentially and periodically. The clocks CLK, nCLK, PCLK, and nPCLK may have a logic high value and a logic low value sequentially and periodically. For example, the logic low value may correspond to a voltage of level "0" and the logic high value may correspond to a voltage of level "VDD". The clocks CLK, nCLK, PCLK, and nPCLK may have "0" and "VDD" as logic levels sequentially and periodically. The level of the clock CLK and the level of the clock nCLK may be complementary. The clocks CLK, nCLK, PCLK, and nPCLK will be more fully described with reference to FIGS. 9 and 12.

The clock nCLK may be received through the capacitive element C1, and the clock CLK may be received through the capacitive element C2. The capacitive element C1 may transfer the received clock nCLK to the main charge pump 110, and the capacitive element C2 may transfer the received clock CLK to the main charge pump 110.

The main charge pump 110 may convert the voltage Vin based on the clocks CLK, nCLK, PCLK, and nPCLK received from the outside of the charge pump 100a and the clocks CLK and nCLK transferred from the capacitive elements C1 and C2. The main charge pump 110 may convert the voltage Vin to generate a voltage Vout. The main charge pump 110 may include switches and capacitive elements for the purpose of generating the voltage Vout.

For example, the main charge pump 110 may output the voltage Vout based on the clocks CLK and nCLK transferred from the capacitive elements C1 and C2 and the voltage Vin. For example, in the case where each of the clocks CLK and nCLK has the level of "0" and the level of "VDD" sequentially and periodically, the main charge pump 110 may output the voltage Vout having a level of "Vin+VDD". In detail, since the levels of the clocks CLK and nCLK are complementary, the main charge pump 110 may output the voltage Vout generated based on the clock CLK and the voltage Vout generated based on the clock nCLK sequentially and periodically.

An exemplary configuration of the main charge pump 110 will be described with reference to FIGS. 2 and 3. Exemplary operations of the main charge pump 110 will be described with reference to FIGS. 7 to 12.

Figure 2:
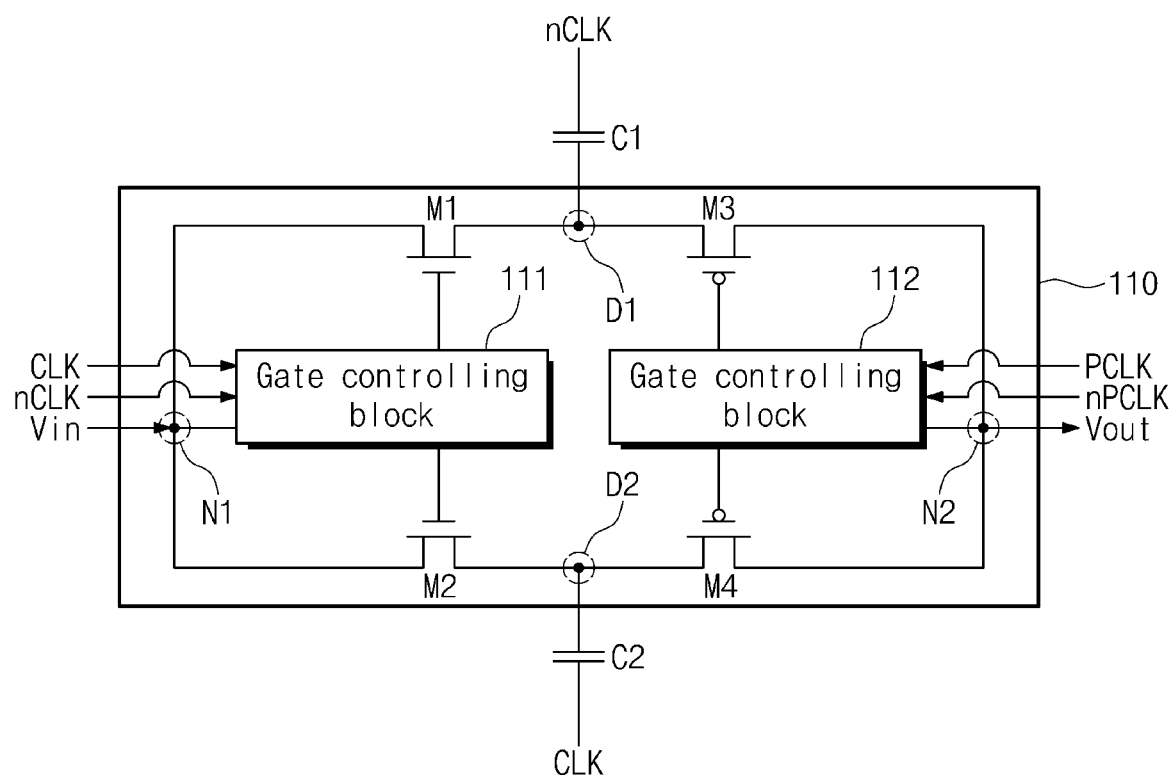
FIG. 2 is a block diagram illustrating an exemplary configuration of a main charge pump of FIG. 1.

FIG. 2 is a block diagram illustrating an exemplary configuration of a main charge pump of FIG. 1.

Referring to FIG. 2, the main charge pump 110 may include switches M1 to M4 and gate controlling blocks 111 and 112. In an example of FIG. 2, each of the switches M1 and M2 may be implemented with an n-type metal oxide semiconductor field effect transistor and each of the switches M3 and M4 may be implemented with a p-type metal oxide semiconductor field effect transistor.

The gate controlling block 111 may be connected with gate terminals of the switches M1 and M2. The gate controlling block 111 may be connected with a node N1. The gate controlling block 112 may be connected with gate terminals of the switches M3 and M4. The gate controlling block 112 may be connected with a node N2.

The switch M1 may be connected between the node N1 and a node D1. The switch M2 may be connected between the node N1 and a node D2. The switch M3 may be connected between the node D1 and a node N2. The switch M4 may be connected between the node D2 and the node N2. The capacitive element C1 may be connected with the node DE The capacitive element C2 may be connected with the node D2.

The gate controlling block 111 may receive the clocks CLK and nCLK. The gate controlling block 111 may control the switches M1 and M2 based on the received clocks CLK and nCLK. For example, the gate controlling block 111 may turn on and turn off the switches M1 and M2 sequentially and periodically based on the clocks CLK and nCLK.

The gate controlling block 112 may receive the clocks PCLK and nPCLK. The gate controlling block 112 may control the switches M3 and M4 based on the received clocks PCLK and nPCLK. For example, the gate controlling block 112 may turn on and off the switches M3 and M4 sequentially and periodically based on the clocks PCLK and nPCLK.

The voltage Vin may be received through the node N1. The voltage Vin of the node N1 may be transferred to the node D1 through the switch M1 under control of the gate controlling block 111. The capacitive element C1 may maintain a voltage of the node DE For example, a voltage of level "Yin" may be formed between opposite ends of the capacitive element C1 by the voltage of level "Yin" formed at the node D1 and the clock nCLK of level "0". Energy corresponding to the voltage of level "Vin" may be charged to the capacitive element C1. The voltage of the node D1 may be maintained by the energy charged in the capacitive element C1.

The clock nCLK of level "VDD" may be transferred to the node D1 through the capacitive element C1. Accordingly, a voltage having a level of "Yin+VDD" may be formed at the node D1 by the voltage of level "Yin" maintained by the capacitive element C1 and the clock nCLK of level "VDD" transferred to the node D1. The voltage of the node D1 may be transferred to the node N2 through the switch M3 under control of the gate controlling block 112. The voltage transferred to the node N2 through the switch M3 may be output from the charge pump 100a as the voltage Vout.

Afterwards, the voltage Vin of the node N1 may be transferred to the node D2 through the switch M2 under control of the gate controlling block 111. The capacitive element C2 may maintain a voltage of the node D2. For example, a voltage of level "Yin" may be formed between opposite ends of the capacitive element C2 by the voltage of level "Yin" formed at the node D2 and the clock CLK of level "0". Energy corresponding to the voltage of level "Yin" may be charged to the capacitive element C2. The voltage of the node D2 may be maintained by the energy charged in the capacitive element C2.

The clock CLK of level "VDD" may be transferred to the node D2 through the capacitive element C2. Accordingly, a voltage having a level of "Yin+VDD" may be formed at the node D2 by the voltage of level "Yin" maintained by the capacitive element C2 and the clock CLK of level "VDD" transferred to the node D2. The voltage of the node D2 may be transferred to the node N2 through the switch M4 under control of the gate controlling block 112. The voltage transferred to the node N2 through the switch M4 may be output from the charge pump 100a as the voltage Vout.

The operations described with reference to FIG. 2 may be performed periodically and repeatedly in response to the clocks CLK, nCLK, PCLK, and nPCLK.

Figure 3:
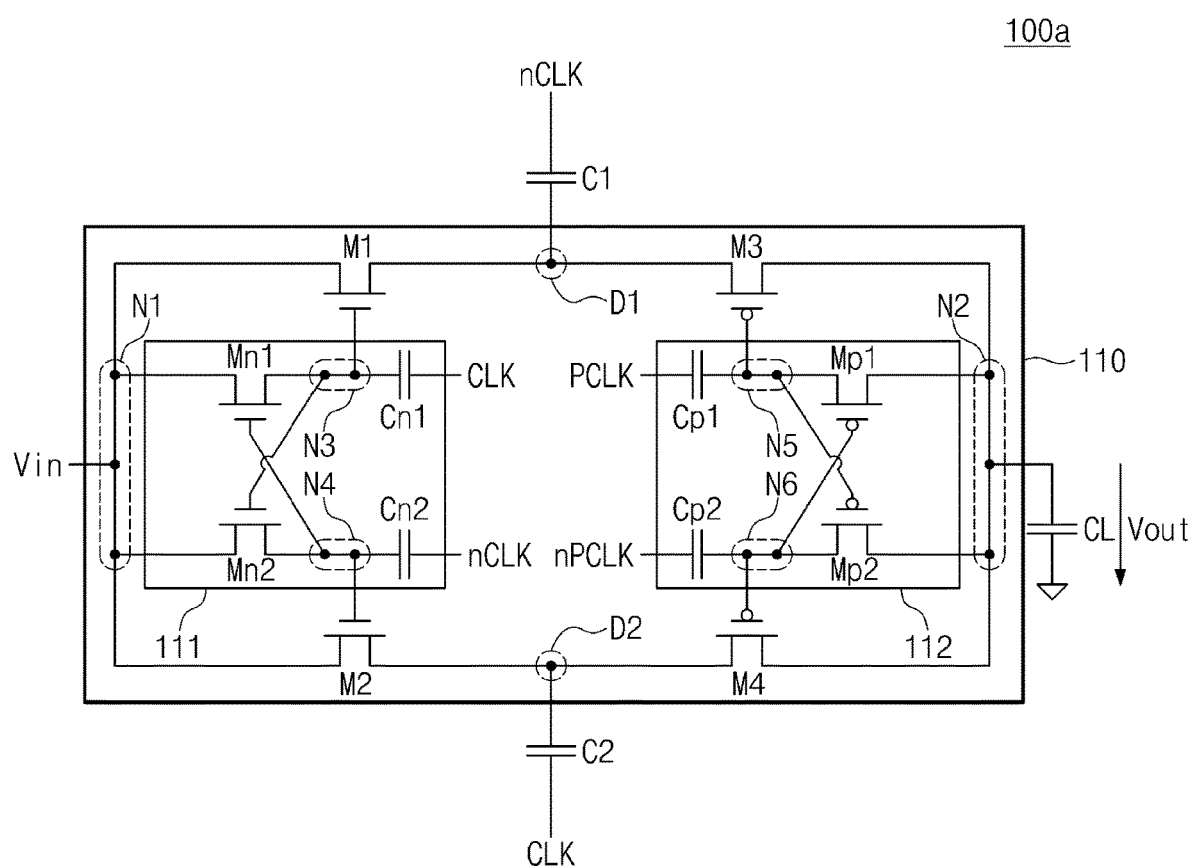
FIG. 3 is a circuit diagram illustrating exemplary configurations of gate controlling blocks of FIG. 2.

FIG. 3 is a circuit diagram illustrating exemplary configurations of gate controlling blocks of FIG. 2.

In an example of FIG. 3, each of switches Mn1 and Mn2 may be implemented with an n-type metal oxide semiconductor field effect transistor and each of switches Mp1 and Mp2 may be implemented with a p-type metal oxide semiconductor field effect transistor. A load connected to the charge pump 100a may be modeled by a capacitive element CL connected between the node N2 and an equipotential terminal.

Referring to FIG. 3, the gate controlling block 111 may include the switches Mn1 and Mn2 and capacitive elements Cn1 and Cn2. The switches Mn1 and Mn2 may be connected to each other in a cross-coupled structure. A gate terminal of the switch Mn1 may be connected with a node N4. The switch Mn1 may be connected between the node N1 and a node N3. A gate terminal of the switch Mn2 may be connected with the node N3. The switch Mn2 may be connected between the node N1 and the node N4.

The capacitive element Cn1 may be connected between the node N3 and a supply terminal of the clock CLK. The capacitive element Cn2 may be connected between the node N4 and a supply terminal of the clock nCLK. A gate terminal of the switch M1 may be connected with the node N3. A gate terminal of the switch M2 may be connected with the node N4.

The gate controlling block 112 may include the switches Mp1 and Mp2 and capacitive elements Cp1 and Cp2. The switches Mp1 and Mp2 may be connected to each other in a cross-coupled structure. A gate terminal of the switch Mp1 may be connected with a node N6. The switch Mp1 may be connected between the node N2 and a node N5. A gate terminal of the switch Mp2 may be connected with the node N5. The switch Mp2 may be connected between the node N2 and the node N6.

The capacitive element Cp1 may be connected between the node N5 and a supply terminal of the clock PCLK. The capacitive element Cp2 may be connected between the node N6 and a supply terminal of the clock nPCLK. A gate terminal of the switch M3 may be connected with the node N5. A gate terminal of the switch M4 may be connected with the node N6.

The switch M1 and the switch Mn2 may be turned on in response to the clock CLK of level "VDD" transferred through the capacitive element Cn1, and the switch M2 and the switch Mn1 may be turned off in response to the clock nCLK of level "0" transferred through the capacitive element Cn2. The voltage Vin of the node N1 may be transferred to the node D1 through the turned-on switch M1.

The switch M3 and the switch Mp2 may be turned on in response to the clock PCLK of level "0" transferred through the capacitive element Cp1, and the switch M4 and the switch Mp1 may be turned off in response to the clock nPCLK of level "VDD" transferred through the capacitive element Cn2. The voltage of the node D1 may be transferred to the node N2 through the turned-on switch M3.

The switch M1 and the switch Mn2 may be turned off in response to the clock CLK of level "0" transferred through the capacitive element Cn1, and the switch M2 and the switch Mn1 may be turned on in response to the clock nCLK of level "VDD" transferred through the capacitive element Cn2. The voltage Vin of the node N1 may be transferred to the node D2 through the turned-on switch M2.

The switch M3 and the switch Mp2 may be turned off in response to the clock PCLK of level "VDD" transferred through the capacitive element Cp1, and the switch M4 and the switch Mp1 may be turned on in response to the clock nPCLK of level "0" transferred through the capacitive element Cn2. The voltage of the node D2 may be transferred to the node N2 through the turned-on switch M4.

The operations described with reference to FIG. 3 may be performed periodically and repeatedly in response to the clocks CLK, nCLK, PCLK, and nPCLK. Exemplary operations of the main charge pump 110 over time will be described with reference to FIGS. 7 to 12.

Figure 4:
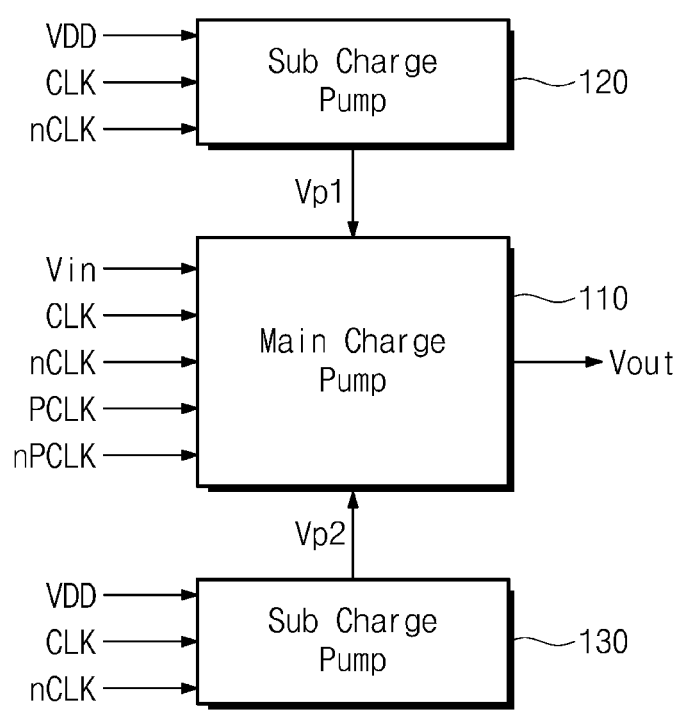
FIG. 4 is a block diagram illustrating a charge pump according to an embodiment of the disclosure.

FIG. 4 is a block diagram illustrating a charge pump according to an embodiment of the disclosure.

Referring to FIG. 4, a charge pump 100b may include the main charge pump 110 and sub charge pumps 120 and 130. The clocks CLK, nCLK, PCLK, and nPCLK and the voltages VDD and Vin received by the charge pump 100b are similar to those described with reference to FIG. 1 and, thus, additional description will be omitted to avoid redundancy.

The sub charge pump 120 may generate a voltage Vp1, which the main charge pump 110 will use to convert the voltage Vin, based on the voltage VDD and the clocks CLK and nCLK. The sub charge pump 120 may include switches and capacitive elements for the purpose of generating the voltage Vp1. The sub charge pump 120 may output the voltage Vp1 to the main charge pump 110.

The sub charge pump 130 may generate a voltage Vp2, which the main charge pump 110 will use to convert the voltage Vin, based on the voltage VDD and the clocks CLK and nCLK. The sub charge pump 130 may include switches and capacitive elements for the purpose of generating the voltage Vp2. The sub charge pump 130 may output the voltage Vp2 to the main charge pump 110.

The sub charge pumps 120 and 130 may output the voltages Vp1 and Vp2 sequentially and periodically. An exemplary configuration of the sub charge pumps 120 and 130 will be described with reference to FIGS. 5 and 6. Exemplary operations of the sub charge pumps 120 and 130 will be described with reference to FIGS. 7 to 12.

The main charge pump 110 may receive the voltages Vp1 and Vp2 from the sub charge pumps 120 and 130. The main charge pump 110 may convert the voltage Vin based on the received clocks CLK, nCLK, PCLK, and nPCLK and the received voltages Vp1 and Vp2. The main charge pump 110 may convert the voltage Vin to generate the voltage Vout. The main charge pump 110 may include switches and capacitive elements for the purpose of generating the voltage Vout.

For example, the main charge pump 110 may output the voltage Vout of level "Vin+Vp1" based on the voltages Vin and Vp1. The main charge pump 110 may output the voltage Vout of level "Vin+Vp2" based on the voltages Vin and Vp2. The main charge pump 110 may output the voltage Vout of level "Vin+Vp1" and the voltage Vout of level "Vin+Vp2" sequentially and periodically. For example, in the case where levels of the voltages Vp1 and Vp2 are "2*VDD", the main charge pump 110 may output the voltage Vout of level "Vin+2*VDD".

The charge pump 100b may be a component of an electronic device. For example, the electronic device may be one of electronic devices such as a personal computer (PC), a workstation, a notebook computer, a mobile device, etc. For example, the charge pump 100b may be configured to supply a voltage having a particular level to components included in the electronic device. For example, the charge pump 100b may supply the voltage Vout to any other components of the electronic device. An exemplary electronic device including the charge pump 100b will be more fully described with reference to FIGS. 16 and 17.

For example, the charge pump 100b may be a component of a memory device included in the electronic device. The charge pump 100b may generate the voltage Vout which is converted to have a level required by various components of the memory device. The charge pump 100b may output the voltage Vout to a memory array and an address decoder of the memory device. An exemplary memory device including the charge pump 100b will be more fully described with reference to FIG. 18.

Figure 5:
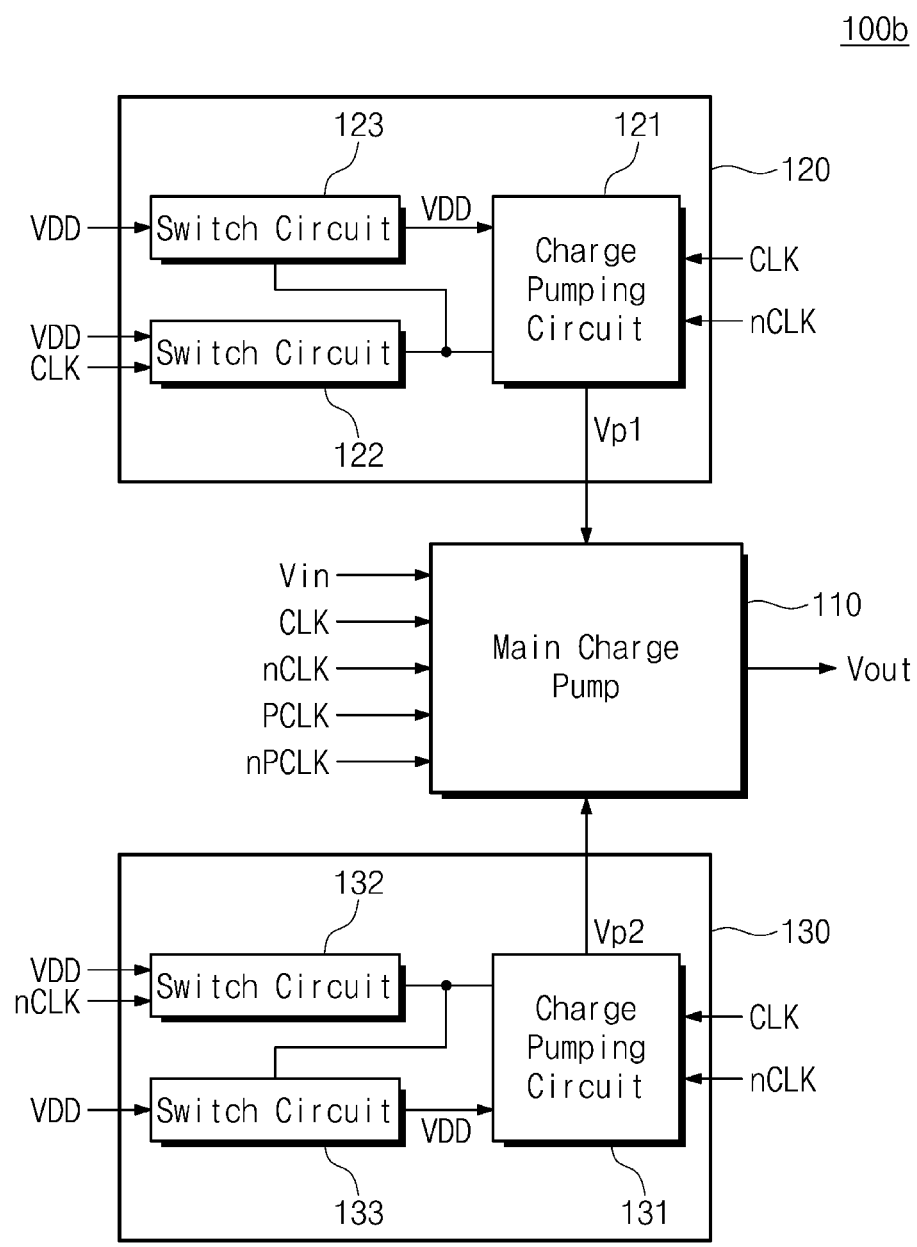
FIG. 5 is a block diagram illustrating exemplary configurations of sub charge pumps of FIG. 4.

FIG. 5 is a block diagram illustrating exemplary configurations of sub charge pumps of FIG. 4.

Referring to FIG. 5, the sub charge pump 120 may include a charge pumping circuit 121 and switch circuits 122 and 123. The charge pumping circuit 121 may be connected with the switch circuits 122 and 123. The switch circuit 123 may be connected with a node between the switch circuit 122 and the charge pumping circuit 121. The switch circuit 122 may transfer the voltage VDD to the node between the switch circuit 122 and the charge pumping circuit 121 in response to the clock CLK. The switch circuit 123 may transfer the voltage VDD to the charge pumping circuit 121 in response to a voltage formed at the node between the switch circuit 122 and the charge pumping circuit 121.

The charge pumping circuit 121 may generate the voltage Vp1 based on the voltage VDD transferred from the switch circuit 123 and the received clocks CLK and nCLK. The charge pumping circuit 121 may output the generated voltage Vp1 to the main charge pump 110. The output voltage Vp1 may be used to generate the voltage Vout from the voltage Vin by the main charge pump 110.

The sub charge pump 130 may include a charge pumping circuit 131 and switch circuits 132 and 133. The charge pumping circuit 131 may be connected with the switch circuits 132 and 133. The switch circuit 133 may be connected with a node between the switch circuit 132 and the charge pumping circuit 131. The switch circuit 132 may transfer the voltage VDD to the node between the switch circuit 132 and the charge pumping circuit 131 in response to the clock nCLK. The switch circuit 133 may transfer the voltage VDD to the charge pumping circuit 131 in response to a voltage formed at the node between the switch circuit 132 and the charge pumping circuit 131.

The charge pumping circuit 131 may generate the voltage Vp2 based on the voltage VDD transferred from the switch circuit 133 and the received clocks CLK and nCLK. The charge pumping circuit 131 may output the generated voltage Vp2 to the main charge pump 110. The output voltage Vp2 may be used to generate the voltage Vout from the voltage Vin by the main charge pump 110.

FIG. 6 is a circuit diagram illustrating exemplary configurations of switch circuits and a charge pumping circuit of FIG. 5.

In an example of FIG. 6, each of switches M11 and M12 and switches M21 and M22 may be implemented with an n-type metal oxide semiconductor field effect transistor, and each of switches M13 and M14 and switches M23 and M24 may be implemented with a p-type metal oxide semiconductor field effect transistor. An exemplary configuration of the main charge pump 110 is similar to that described with reference to FIG. 3 and thus, additional description will be omitted to avoid redundancy.

Referring to FIG. 6, the charge pumping circuit 121 may include a switch M13 and capacitive elements C11 and C12. The switch circuit 122 may include the switches M11 and M12. The switch circuit 123 may include a switch M14. The capacitive element C12 may be connected between a node N7 and a supply terminal of the clock nCLK. The clock CLK may be received through a gate terminal of the switch M13. The switch M13 may be connected between the node N7 and a node N8. The capacitive element C11 may be connected between the node N8 and the node D1.

The clock CLK may be received through a gate terminal of the switch M11. The switch M11 may be connected between the switch M12 and the equipotential terminal. Various levels of voltages necessary for an operation of the sub charge pump 120 may be supplied through the equipotential terminal. Below, for better understanding, an embodiment in which a voltage of the equipotential terminal is a ground voltage will be described, but the disclosure is not limited thereto. The voltage VDD may be received through a gate terminal of the switch M12. The switch M12 may be connected between the switch M11 and the node N8. A gate terminal of the switch M14 may be connected with the node N8. The switch M14 may be connected between the node N7 and a supply terminal of the voltage VDD.

The capacitive element C12 may maintain a voltage of the node N7. In detail, the capacitive element C12 may maintain a level of a voltage formed at the node N7 during a particular time interval as the capacitive element C12 is charged by the voltage transferred to the node N7 by the switch M14. Also, the capacitive element C12 may transfer the clock nCLK to the node N7.

The capacitive element C11 may maintain a voltage of the node DE In detail, the capacitive element C11 may maintain a level of a voltage formed at the node D1 during a particular time interval as the capacitive element C11 is charged by the voltage transferred to the node D1 from the node N1. Also, the capacitive element C11 may transfer a voltage (corresponding to the voltage Vp1 of FIG. 4) of the node N8 to the node D1.

When the switch M11 is turned on in response to the clock CLK, a voltage of the equipotential terminal may be transferred to the switch M12 through the switch M11. When the switch M12 is turned on in response to the voltage VDD, the voltage transferred from the switch M11 may be transferred to the node N8 through the switch M12. When the switch M14 is turned on in response to the voltage of the node N8, the voltage VDD may be transferred to the node N7 through the switch M14. When the switch M13 is turned on in response to the clock CLK, the voltage of the node N7 may be transferred to the node N8 through the switch M13.

Referring to FIG. 6, the charge pumping circuit 131 may include a switch M23 and capacitive elements C21 and C22. The switch circuit 132 may include the switches M21 and M22. The switch circuit 133 may include a switch M24.

A configuration and operations of the sub charge pump 130 may respectively correspond to the configuration and the operations of the sub charge pump 120. Configurations and operations of the switches M21, M22, M23, and M24 and the capacitive elements C21 and C22 respectively correspond to the configurations and the operations of the switches M11, M12, M13, and M14 and the capacitive elements C11 and C12 and the nodes N7 and N8 respectively correspond to nodes N9 and N10 and, thus, additional description will be omitted to avoid redundancy.

However, instead of the clock CLK, the clock nCLK may be input to a gate terminal of the switch M21. The switch M21 may be turned on in response to the clock nCLK. Instead of the clock CLK, the clock nCLK may be input to a gate terminal of the switch M23. The switch M23 may be turned on in response to the clock nCLK. The capacitive element C22 may be connected with a supply terminal of the clock CLK. The capacitive element C22 may transfer the clock CLK to the node N9.

Exemplary operations of the sub charge pumps 120 and 130 over time will be described with reference to FIGS. 7 to 12.

Figure 7:
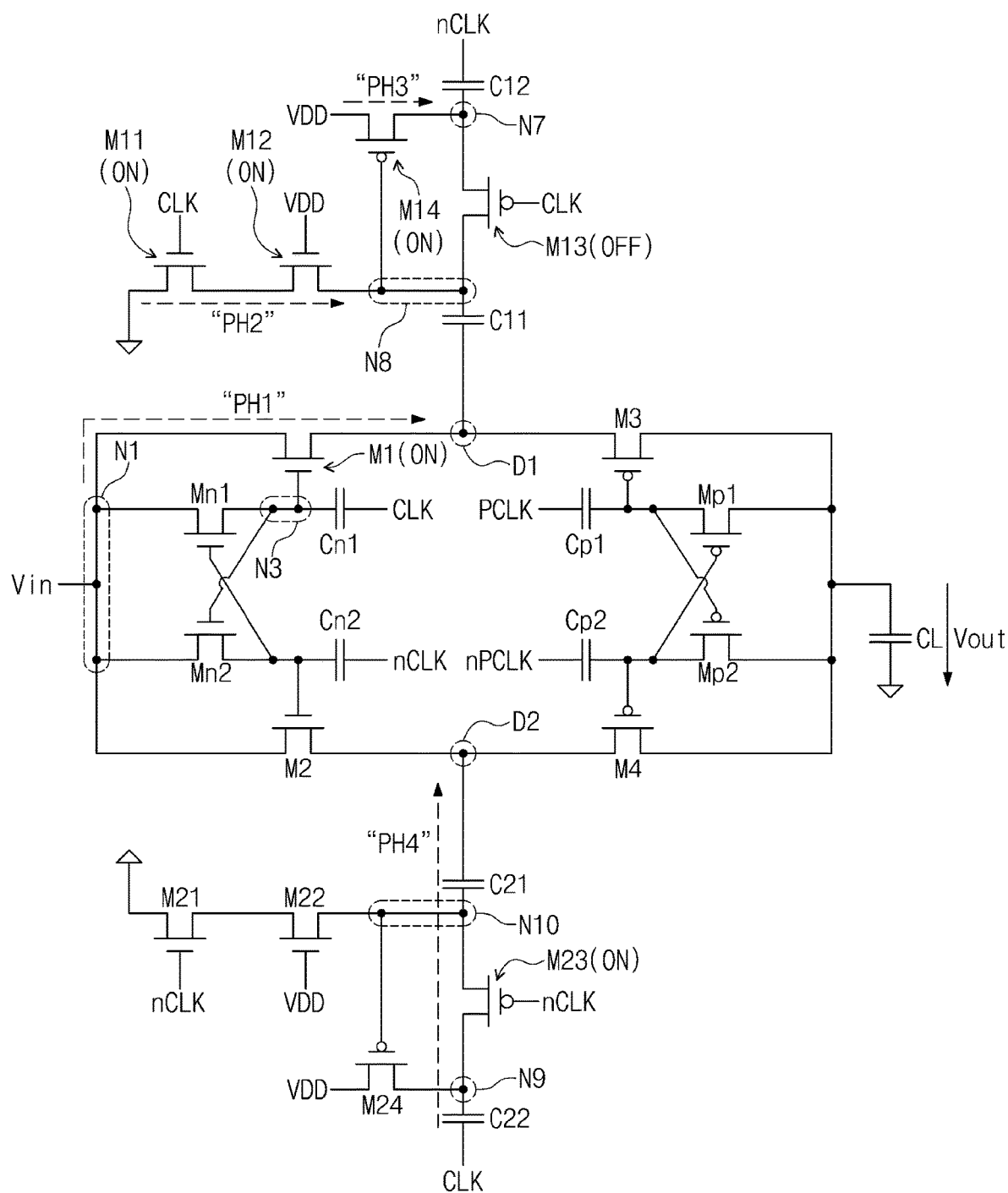
FIG. 7 is a circuit diagram illustrating exemplary operations of a charge pump of FIG. 6.

FIG. 7 is a circuit diagram illustrating exemplary operations of a charge pump of FIG. 6.

Below, for better understanding, the clocks CLK, nCLK, PCLK, and nPCLK having levels of "0" and "VDD" periodically will be described with reference to FIGS. 7 to 12, but the disclosure is not limited thereto. Voltages transferred along paths PH1 to PH4 based on the clock CLK having a level of "VDD" and the clock nCLK having a level of "0" will be described with reference to FIG. 7.

The voltage Vin may be transferred from the node N1 to the node D1 along the path PHE In detail, the switch M1 may be turned on in response to the level "VDD" of the clock CLK transferred to the node N3 through the capacitive element Cn1. A voltage of level "Vin" may be formed at the node D1 by the voltage Vin transferred through the switch M1.

The ground voltage may be transferred to the node N8 along the path PH2. In detail, the switch M11 may be turned on in response to the level "VDD" of the clock CLK. The switch M12 may be turned on in response to the voltage VDD. A voltage of level "0" may be formed at the node N8 by the ground voltage transferred through the switches M11 and M12.

As described with reference to the path PH2, since the voltage of level "0" is formed at the node N8, a voltage across the capacitive element C11 may be "Vin". The capacitive element C11 may maintain the voltage of level "Vin". In detail, energy corresponding to the voltage of level "Vin" may be charged to the capacitive element C11, by the voltage across the capacitive element C11. Afterwards, a level of the voltage of the node D1 may be maintained at "Yin" by the capacitive element C11.

The voltage VDD may be transferred to the node N7 along the path PH3. In detail, the switch M14 may be turned on in response to a level "0" of a voltage of the node N8. A voltage of level "VDD" may be formed at the node N7 by the voltage VDD transferred through the switch M14. Since the level of the clock nCLK is "0", a voltage across the capacitive element C12 may be "VDD". The capacitive element C12 may maintain the voltage formed at the node N7. In detail, energy corresponding to the voltage of level "VDD" may be charged to the capacitive element C12, by the voltage across the capacitive element C12. However, the voltage of level "VDD" charged to capacitive element C12 at node N7 is not transferred to node 8 because switch M13 is turned off in response to a voltage of level "VDD" provided by the clock CLK supplied to the gate of switch M13. Afterwards, a level of the voltage of the node N7 may be maintained at "VDD" by the capacitive element C12.

Before the clock CLK is transferred along the path PH4, the capacitive element C22 may maintain a voltage of level "VDD", by an operation similar to the operation described with reference to the path PH3. Accordingly, a level of a voltage of the node N9 may be "VDD", before the clock CLK of "VDD" is input to the capacitive element C22.

Before the clock CLK is transferred along the path PH4, the capacitive element C21 may maintain a voltage of level "Vin", by an operation similar to the operation described with reference to the paths PH1 and PH2. Accordingly, before the clock CLK is transferred along the path PH4, a voltage of level "0" may be formed at the node N10, and a voltage of level "Yin" may be formed at the node D2.

The clock CLK may be transferred to the node D2 along the path PH4. In detail, the switch M23 may be turned on in response to the level "0" of the clock nCLK. As the clock CLK of level "VDD" is transferred through the capacitive element C22, a level of the voltage of the node N9 may increase from "VDD" to "2*VDD". As the voltage of level "2*VDD" formed at the node N9 is transferred to the node N10 through the switch M23, a level of the voltage of the node N10 may increase from "0" to "2*VDD". As the voltage of level "2*VDD" formed at the node N10 is transferred to the node D2 through the capacitive element C21, a level of the voltage of the node D2 may increase from "Yin" to "Yin+2*VDD".

That is, a level of a voltage transferred from the sub charge pump 130 to the main charge pump 110 may be "2*VDD". Referring to FIGS. 4 and 7 together, the voltage Vp2 of FIG. 4 may be a voltage transferred along the path PH4 of FIG. 7. Accordingly, the level of the voltage Vp2 may be "2*VDD". An exemplary operation of the charge pump 100b for outputting the voltage Vout from the voltage Vp2 of level "2*VDD" transferred from the sub charge pump 130 will be described with reference to FIG. 8.

Figure 8:
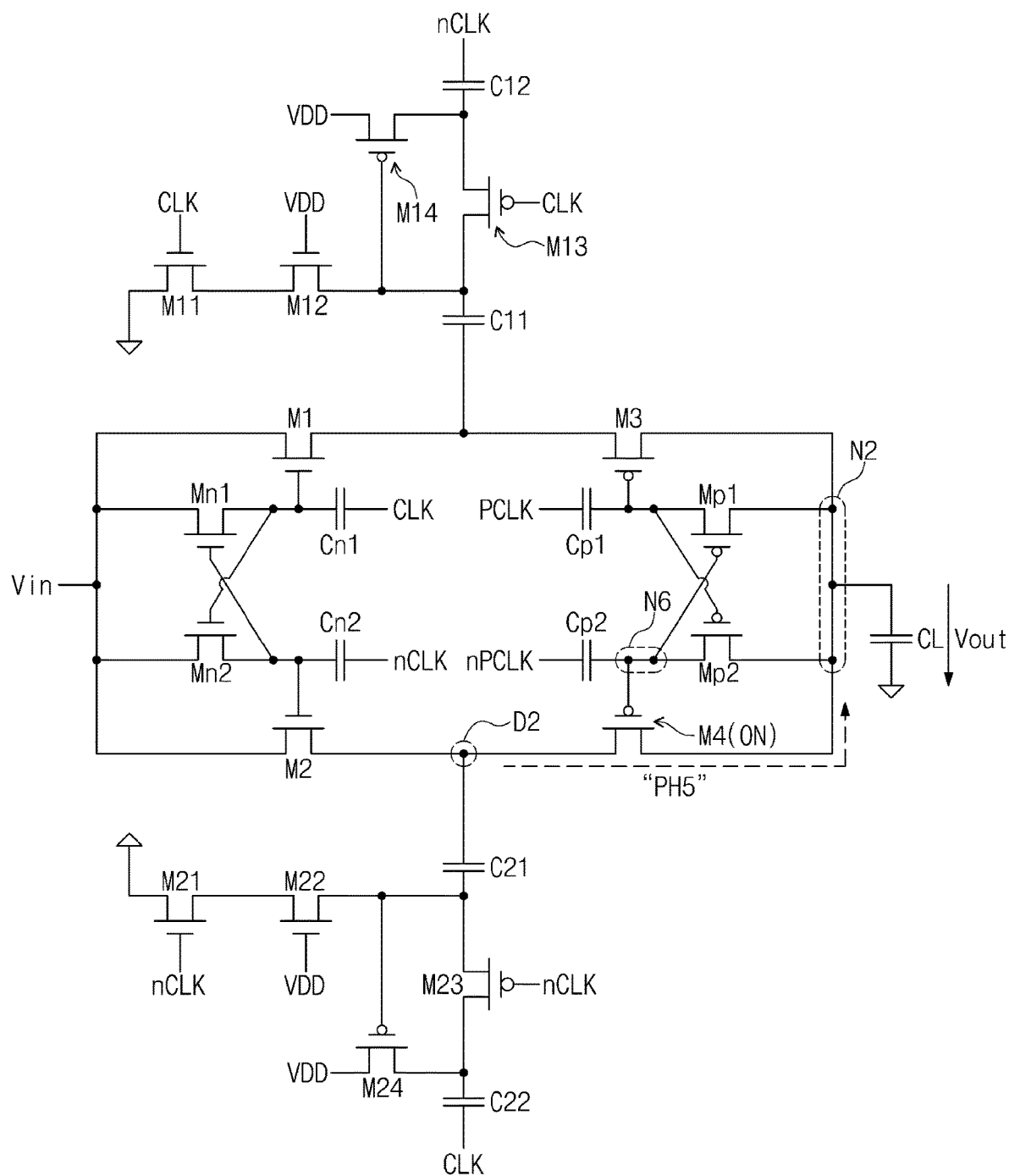
FIG. 8 is a circuit diagram illustrating exemplary operations of a charge pump of FIG. 6.

FIG. 8 is a circuit diagram illustrating exemplary operations of a charge pump of FIG. 6.

Operations of the charge pump 100b to be described with reference to FIG. 8 may be performed after the operations of the charge pump 100b described with reference to FIG. 7. A voltage transferred along a path PH5 based on the clock PCLK having a level of "VDD" and the clock nPCLK having a level of "0" will be described with reference to FIG. 8.

A voltage of level "Yin+2*VDD" may be transferred from the node D2 to the node N2 along the path PH5. In detail, the switch M4 may be turned on in response to the level "0" of the clock nPCLK transferred to the node N6 through the capacitive element Cp2. The voltage of level "Vin+2*VDD" may be formed at the node N2 by a voltage transferred through the switch M4. The voltage of the node N2 may be output from the charge pump 100b as the voltage Vout.

Figure 9:
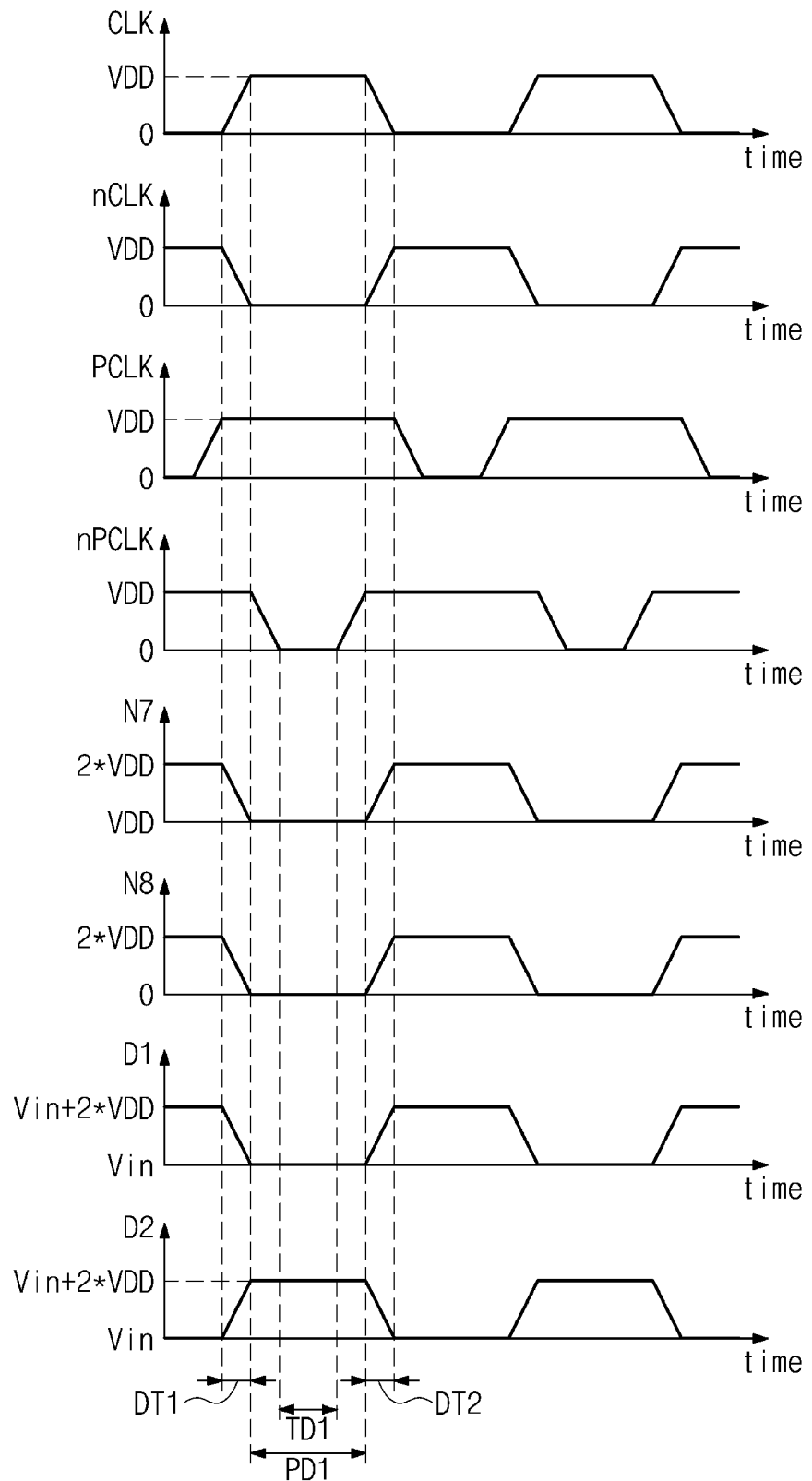
FIG. 9 is a timing diagram illustrating exemplary operations of a charge pump of FIGS. 7 and 8.

FIG. 9 is a timing diagram illustrating exemplary operations of a charge pump of FIGS. 7 and 8. In an example of FIG. 9, the x-axes represent time and the y-axes represent voltages of the clocks CLK, nCLK, PCLK, and nPCLK and the nodes D1, D2, N7, and N8, respectively. Below, exemplary operations of the charge pump 100b which are performed during a time interval PD1 will be described with reference to FIG. 9.

A designer of the charge pump 100b may respectively include time intervals DT1 and DT2 before and after the time interval PD1 for the purpose of securing the stability of operations to be performed by the charge pump 100b. For example, the designer may insert the time intervals DT1 and DT2 such that the operations described with reference to FIG. 7 and the operations described with reference to FIG. 8 do not overlap each other. Also, the designer may insert the time interval DT2 such that the operations described with reference to FIGS. 7 and 8 and operations to be described with reference to FIGS. 10 and 11 do not overlap each other. For example, the designer may control a clock generator generating the clocks CLK, nCLK, PCLK, and nPCLK for the purpose of inserting the time intervals DT1 and DT2.

As the time interval DT2 is inserted after the time interval DT1, a time enough for the charge pump 100b to perform operations of the time interval PD1 may be secured. Accordingly, the charge pump 100b may perform any other operations after sufficiently performing the operations of the time interval PD1 (e.g., after a transition state of voltages according to the operations of the time interval PD1 is terminated), and thus, the stability of the operations performed by the charge pump 100b may be improved.

During the time interval PD1, a level of the clock CLK may be "VDD", a level of the clock nCLK may be "0", and a level of the clock PCLK may be "VDD". A level of the clock nPCLK may be "0" during a time interval TD1 included in the time interval PD1.

As described with reference to FIG. 7, before the time interval DT1, a voltage of level "2*VDD" may be formed at the node N8 by a voltage transferred through the switch M13. Afterwards, during the time interval TD1, by a ground voltage transferred along the path PH2 based on the level "VDD" of the clock CLK, a level of the voltage of the node N8 may decrease to "0" and may be maintained.

As described with reference to FIG. 7, before the time interval DT1, a voltage of level "2*VDD" may be formed at the node N7 by a voltage transferred from the capacitive element C12. Afterwards, during the time interval PD1, by the voltage "VDD" transferred along the path PH3 based on the level "0" of the voltage of the node N8, a level of the voltage of the node N7 may decrease to "VDD" and may be maintained.

As described with reference to FIG. 7, during the time interval PD1, a level of the voltage of the node D1 may be maintained at "Yin", by the voltage "Yin" transferred along the path PH1 based on the level "VDD" of the clock CLK. Also, during the time interval PD1, by the clock CLK transferred along the path PH4 based on the level "0" of the clock nCLK, a level of the voltage of the node D2 may increase to "Yin+2*VDD" and may be maintained.

During the time interval TD1, by a voltage of the node D2 transferred along the path PH5 based on the level "0" of the clock nPCLK, the voltage Vout of level "Yin+2*VDD" may be output from the charge pump 100b.

Figure 10:
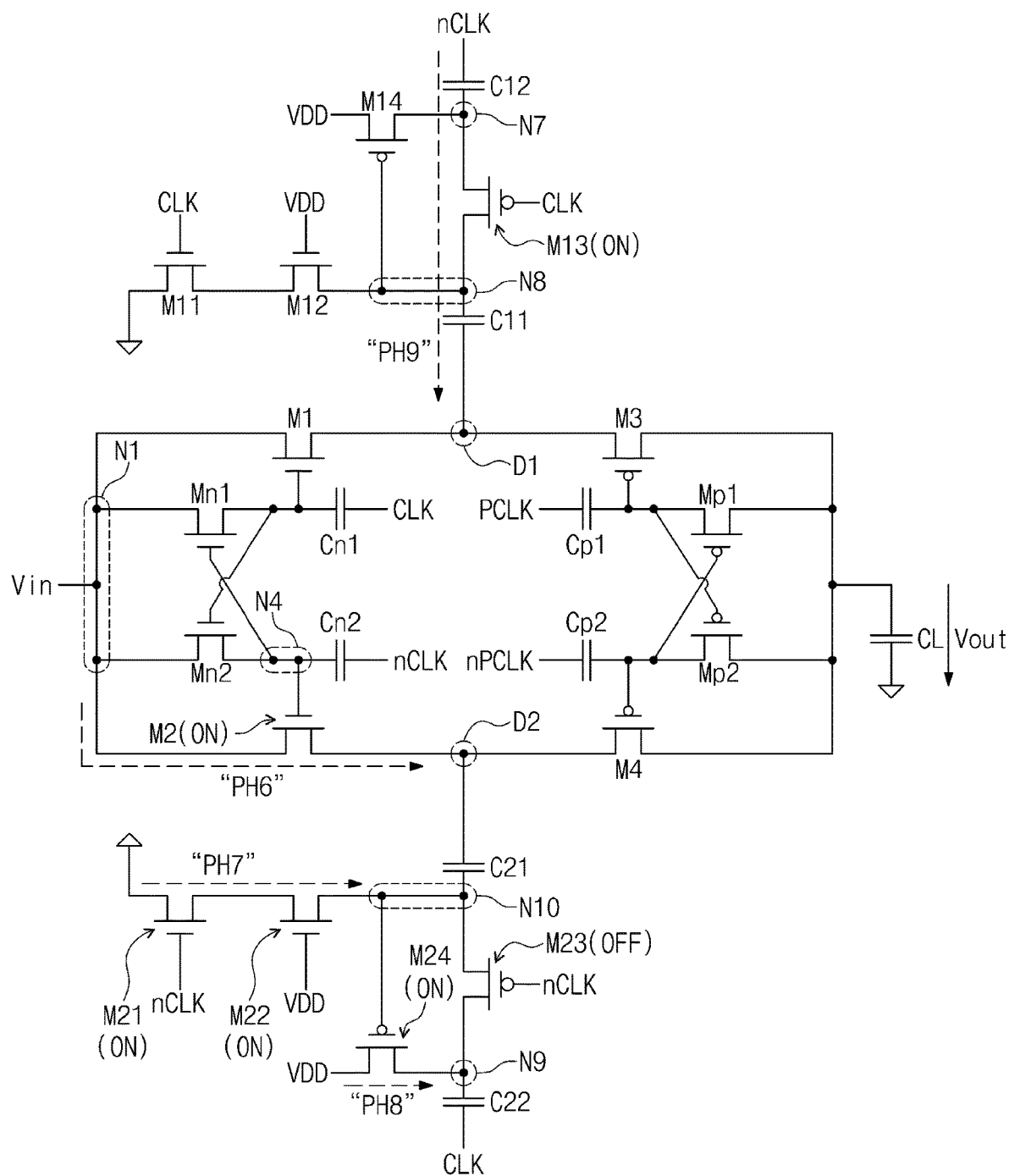
FIG. 10 is a circuit diagram illustrating exemplary operations of a charge pump of FIG. 6.

FIG. 10 is a circuit diagram illustrating exemplary operations of a charge pump of FIG. 6.

Operations of the charge pump 100b to be described with reference to FIG. 10 may be performed after the operations of the charge pump 100b described with reference to FIGS. 7 to 9. Voltages transferred along paths PH6 to PH9 based on the clock CLK having a level of "0" and the clock nCLK having a level of "VDD" will be described with reference to FIG. 10.

The voltage Vin may be transferred from the node N1 to the node D2 along the path PH6. In detail, the switch M2 may be turned on in response to the level "VDD" of the clock nCLK transferred to the node N4 through the capacitive element Cn2. A voltage of level "Yin" may be formed at the node D2 by the voltage Vin transferred through the switch M2.

The ground voltage may be transferred to the node N10 along the path PH7. In detail, the switch M21 may be turned on in response to the level "VDD" of the clock nCLK. The switch M22 may be turned on in response to the voltage VDD. A voltage of level "0" may be formed at the node N10 by the ground voltage transferred through the switches M21 and M22.

As described with reference to the path PH7, since the voltage of level "0" is formed at the node N10, a voltage across the capacitive element C21 may be "Yin". The capacitive element C21 may maintain the voltage of level "Yin". In detail, energy corresponding to the voltage of level "Yin" may be charged to the capacitive element C21, by the voltage across the capacitive element C21. Afterwards, a level of the voltage of the node D2 may be maintained at "Yin" by the capacitive element C21.

The voltage VDD may be transferred to the node N9 along the path PH8. In detail, the switch M24 may be turned on in response to a level "0" of a voltage of the node N10. A voltage of level "VDD" may be formed at the node N9 by the voltage VDD transferred through the switch M24. Since the level of the clock CLK is "0", a voltage across the capacitive element C22 may be "VDD". The capacitive element C22 may maintain the voltage of level "VDD". In detail, energy corresponding to the voltage of level "VDD" may be charged to the capacitive element C22, by the voltage across the capacitive element C22. Afterwards, a level of the voltage of the node N10 may be maintained at "VDD" by the capacitive element C22.

Before the clock nCLK is transferred along the path PH9, as described with reference to FIG. 7, by the voltage VDD transferred along the path PH3, the capacitive element C12 may store the energy corresponding to the voltage of level "VDD". Accordingly, a level of the voltage of the node N7 may be "VDD", before the clock nCLK of "VDD" is input to the capacitive element C12.

Before the clock nCLK is transferred along the path PH9, as described with reference to FIG. 7, by the voltage Vin and the ground voltage transferred along the paths PH1 and PH2, the capacitive element C11 may store the energy corresponding to the voltage of level "Yin". Accordingly, before the clock nCLK is transferred along the path PH9, a level of the voltage of the node N8 may be "0", and a level of the voltage of the node D1 may be "Yin".

The clock nCLK may be transferred to the node D1 along the path PH9. In detail, the switch M13 may be turned on in response to the level "0" of the clock CLK. As the clock nCLK of level "VDD" is transferred through the capacitive element C12, a level of the voltage of the node N7 may increase to "2*VDD". As the voltage of level "2*VDD" formed at the node N7 is transferred to the node N8 through the switch M13, a level of the voltage of the node N8 may increase from "0" to "2*VDD". As the voltage of level "2*VDD" formed at the node N8 is transferred to the node D1 through the capacitive element C11, a level of the voltage of the node D1 may increase from "Yin" to "Yin+2*VDD".

That is, a level of a voltage transferred from the sub charge pump 120 to the main charge pump 110 may be "2*VDD". Referring to FIGS. 4 and 10 together, the voltage Vp1 of FIG. 4 may be a voltage transferred along the path PH9 of FIG. 10. Accordingly, the level of the voltage Vp1 may be "2*VDD". An exemplary operation of the charge pump 100b for outputting the voltage Vout from the voltage Vp1 of level "2*VDD" transferred from the sub charge pump 120 will be described with reference to FIG. 11.

Since the charge pump 100b performs periodic and iterative operations based on the clocks CLK, nCLK, PCLK, and nPCLK, the operations described with reference to FIG. 10 may be performed similarly before the operations described with reference to FIG. 7 (i.e., before the time interval DT1 of FIG. 9). For example, as described with reference to FIG. 7, before the clock CLK is transferred along the path PH4, a level of the voltage of the node N10 is "0", a level of the voltage of the node N9 is "VDD", and a level of the voltage of the node D2 is "Yin".

The operations of the charge pump 100b performed before the operations of FIGS. 7 and 8 (i.e., the operations of the charge pump 100b before the time interval DT1 of FIG. 9) may be described with reference to FIG. 10. Before the clock CLK is transferred along the path PH4, a voltage of level "Yin" formed at the node D2 may be formed by the voltage Vin transferred along the path PH6. The voltage of level "0" formed at the node N10 may be formed by the ground voltage transferred along the path PH7. The voltage of level "VDD" formed at the node N9 may be formed by the voltage VDD transferred along the path PH8.

Figure 11:
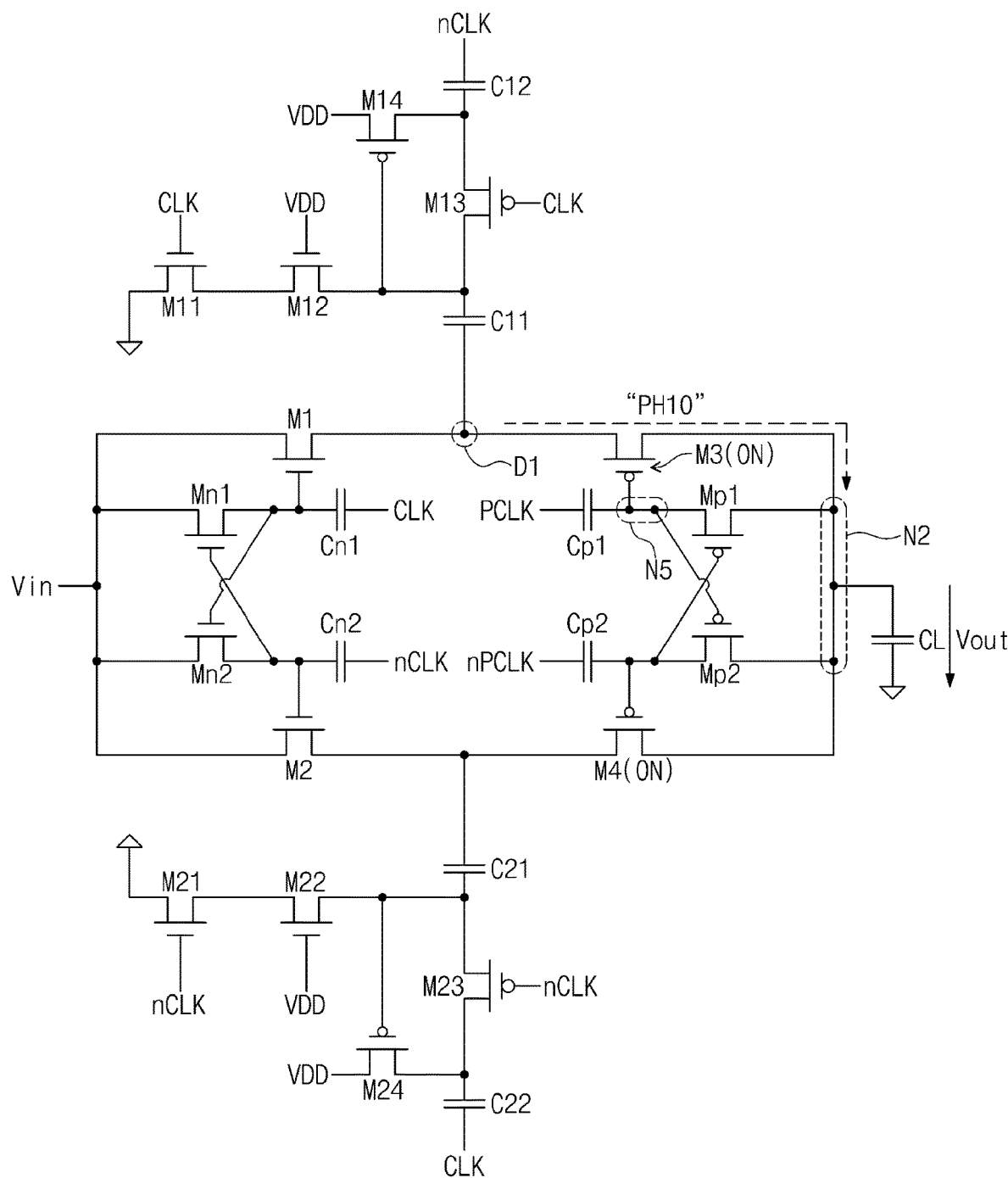
FIG. 11 is a circuit diagram illustrating exemplary operations of a charge pump of FIG. 6.

FIG. 11 is a circuit diagram illustrating exemplary operations of a charge pump of FIG. 6.

Operations of the charge pump 100b to be described with reference to FIG. 11 may be performed after the operations of the charge pump 100b described with reference to FIG. 10. A voltage transferred along a path PH10 based on the clock PCLK having a level of "0" and the clock nPCLK having a level of "VDD" will be described with reference to FIG. 11.

A voltage of level "Yin+2*VDD" may be transferred from the node D1 to the node N2 along the path PH10. In detail, the switch M3 may be turned on in response to the level "0" of the clock PCLK transferred to the node N5 through the capacitive element Cp1. The voltage of level "Vin+2*VDD" may be formed at the node N2 by a voltage transferred through the switch M3. The voltage of the node N2 may be output from the charge pump 100b as the voltage Vout.

Figure 12:
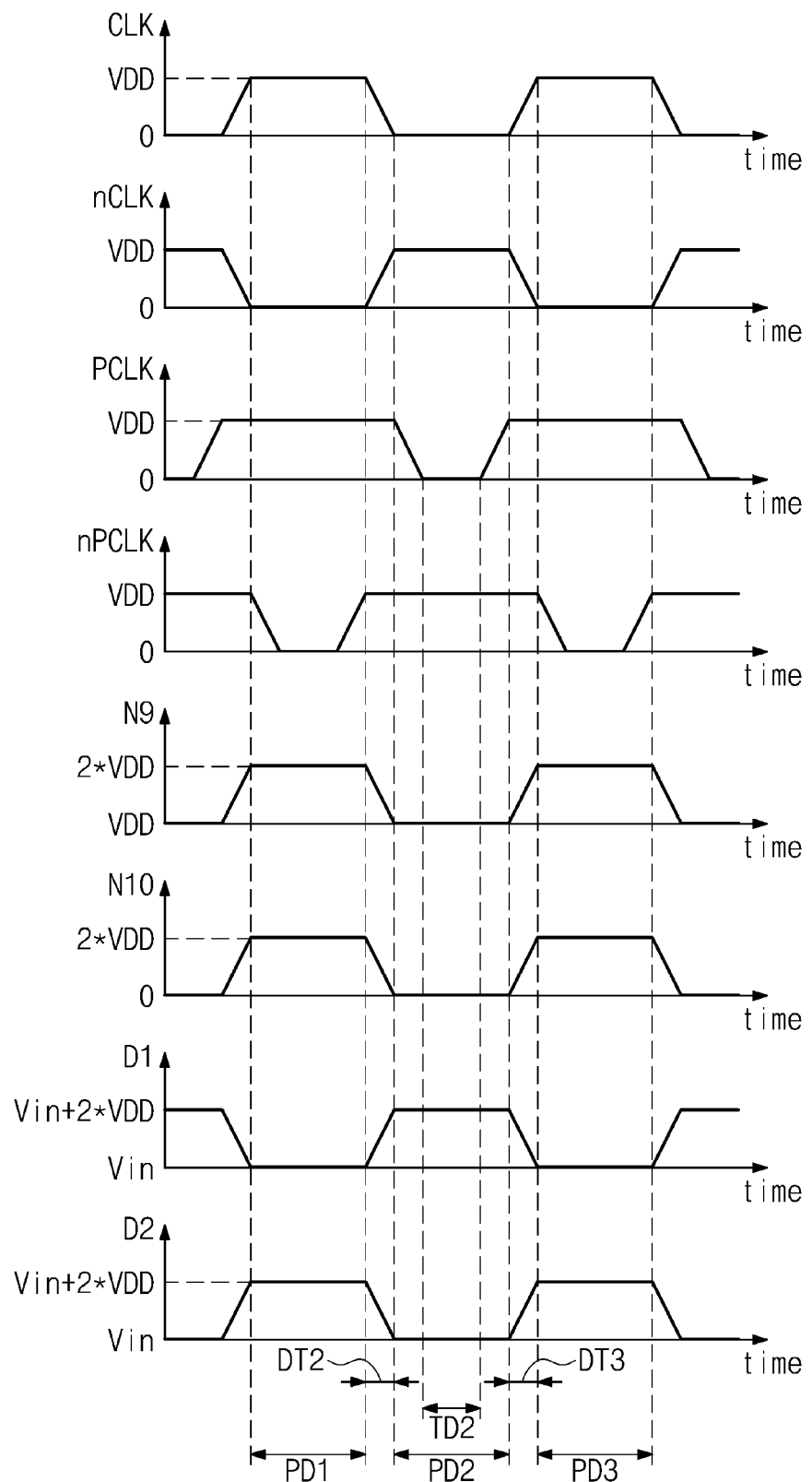
FIG. 12 is a timing diagram illustrating exemplary operations of a charge pump of FIGS. 10 and 11.

FIG. 12 is a timing diagram illustrating exemplary operations of a charge pump of FIGS. 10 and 11. In an example of FIG. 12, the x-axes represent time and the y-axes represent voltages of the clocks CLK, nCLK, PCLK, and nPCLK and the nodes D1, D2, N9, and N10, respectively. Below, exemplary operations of the charge pump 100b which is performed during a time interval PD2 after the time interval PD1 will be described with reference to FIG. 12.

For example, the designer may insert time intervals DT2 and DT3 such that the operations described with reference to FIG. 10 and the operations described with reference to FIG. 11 do not overlap each other. For example, the designer may control a clock generator generating the clocks CLK, nCLK, PCLK, and nPCLK for the purpose of inserting the time intervals DT2 and DT3.

As described with reference to FIG. 9, by the time interval DT2, the charge pump 100b may perform operations of the time interval PD2 after sufficiently performing the operations of the time interval PD2 (e.g., after a transition state of voltages according to the operations of the time interval PD2 is terminated). As in the above description, by the time interval DT3, the charge pump 100b may perform the following operations (e.g., operations similar to the operations of the time interval PD1) after sufficiently performing the operations of the time interval PD2 (e.g., after a transition state of voltages according to the operations of the time interval PD2 is terminated).

During the time interval PD2, a level of the clock CLK may be "0", a level of the clock nCLK may be "VDD", and a level of the clock nPCLK may be "VDD". A level of the clock PCLK may be "0" during a time interval TD2 included in the time interval PD2.

As described with reference to FIG. 9, in the time interval PD1, a voltage of level "2*VDD" may be formed at the node N10 by a voltage transferred through the switch M23. Afterwards, during the time interval TD2, by the ground voltage transferred along the path PH7 based on the level "VDD" of the clock nCLK, a level of the voltage of the node N10 may decrease to "0" and may be maintained.

As described with reference to FIG. 9, in the time interval PD1, a voltage of level "2*VDD" may be formed at the node N9 by a voltage transferred from the capacitive element C22. Afterwards, during the time interval PD2, by the voltage "VDD" transferred along the path PH8 based on the level "0" of the voltage of the node N10, a level of the voltage of the node N9 may decrease to "VDD" and may be maintained.

As described with reference to FIG. 9, in the time interval PD1, a level of the voltage of the node D1 may be maintained at "Yin", by the voltage "Yin" transferred along the path PH1 based on the level "VDD" of the clock CLK. Afterwards, during the time interval PD2, by the clock nCLK transferred along the path PH9 based on the level "0" of the clock CLK, a level of the voltage of the node D1 may increase to "Vin+2*VDD" and may be maintained.

During the time interval TD2, by a voltage of the node D1 transferred along the path PH10 based on the level "0" of the clock PCLK, the voltage Vout of level "Vin+2*VDD" may be output from the charge pump 100b. After the time interval DT3, the operations of the time interval PD1 described with reference to FIG. 9 and the operations of the time interval PD2 described with reference to FIG. 12 may be performed periodically and repeatedly. However, it may be understood that time intervals corresponding to the time intervals DT1 to DT3 are respectively inserted between performed operations, for stability.

After the time interval PD2, the operations of the charge pump 100b corresponding to the time interval PD1 and the operations of the charge pump 100b corresponding to the time interval PD2 may be performed sequentially and repeatedly. For example, operations which are similar to the operations of the time interval PD1 may be performed during a time interval PD3.

Figure 13:
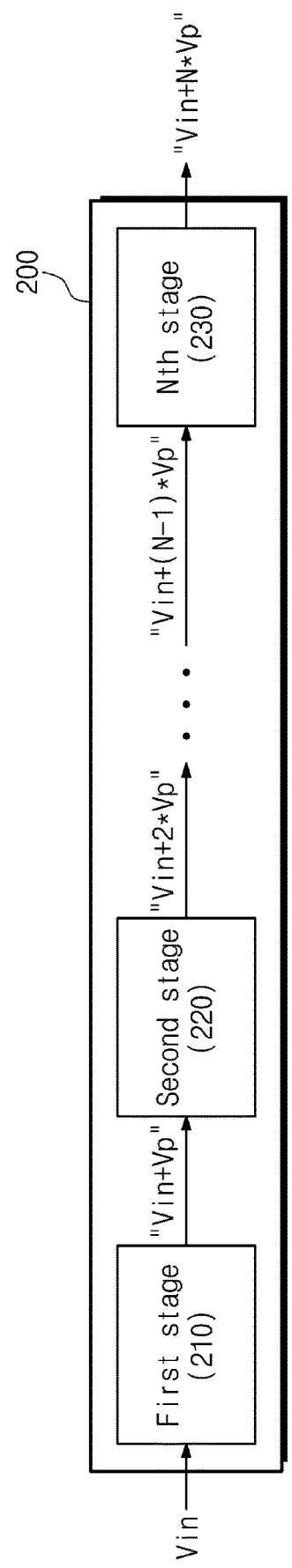
FIG. 13 is a block diagram illustrating an exemplary semiconductor chip including "N" stages.

FIG. 13 is a block diagram illustrating an exemplary semiconductor chip including "N" stages.

Referring to FIG. 13, a semiconductor chip 200 may include "N" stages connected in series. One stage may include at least one of the charge pumps 100a and 100b. Each of first to n-th stages 210 to 230 may output a voltage, a level of which is higher by "Vp" than a level of a received voltage. For better understanding, an embodiment in which levels respectively increased by the first to n-th stages 210 to 230 are identical to each other as "Vp" is described, but it may be understood that the levels respectively increased by the first to N-th stages 210 to 230 are different from each other.

The first stage 210 may output a voltage having a level of "Yin+Vp" based on the voltage Vin. The second stage 220 may receive an output of the first stage 210 as an input. The second stage 220 may output a voltage having a level of "Yin+2*Vp" based on a voltage having a level of "Yin+Vp". The N-th stage 230 may receive an output of the (N−1)-th stage (not illustrated) as an input. The N-th stage 230 may output a voltage having a level of "Yin+N*Vp" based on a voltage having a level of "Yin+(N−1)*Vp".

For example, in the case where each of the first to N-th stages 210 to 230 includes the charge pump 100a of FIG. 1, "Vp" may be "VDD". In this case, the semiconductor chip 200 may output a voltage of "Yin+N*VDD". For example, in the case where each of the first to N-th stages 210 to 230 includes the charge pump 100b of FIG. 4, "Vp" may be "2*VDD". In this case, the semiconductor chip 200 may output a voltage of "Vin+2*N*VDD".

Figure 14:
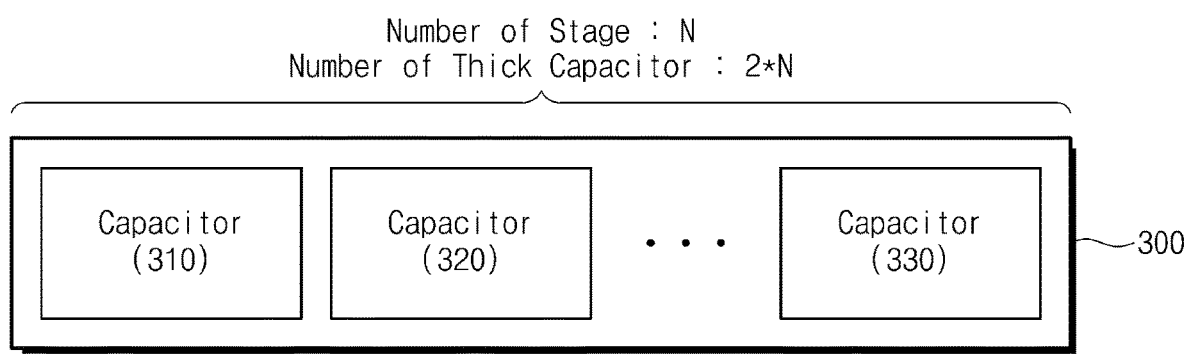
FIG. 14 is a block diagram illustrating an exemplary semiconductor chip including a charge pump of FIG. 1.

FIG. 14 is a block diagram illustrating an exemplary semiconductor chip including a charge pump of FIG. 1.

Referring to FIG. 14, a semiconductor chip 300 may include capacitors 310 to 330. The semiconductor chip 300 may include "N" stages connected in series, and each stage may include one charge pump 100a. The capacitors 310 to 330 may correspond to the capacitive elements C1 and C2 included in each of the "N" charge pumps 100a. For better understanding, only the capacitors 310 to 330 corresponding to the capacitive elements C1 and C2 are illustrated in FIG. 13, but it may be understood that the semiconductor chip 300 may further include any other components in addition to the capacitive elements C1 and C2 for the purpose of constituting the charge pump 100a.

As described with reference to FIG. 13, in the case where the semiconductor chip 300 includes the "N" stages 210 to 230, the semiconductor chip 300 may generate a voltage having a level of "Yin+N*VDD". In the case where "N" is sufficiently great, each of the capacitors of the semiconductor chip 200 may have a thick thickness for the purpose of transferring a voltage of a high level. In the specification, the expression "thickness" may be understood as "size". For example, the expressions that the thickness is "thick" or "thin" may be understood as the expressions that the size is "large" or "small".

As described with reference to FIG. 3, a voltage of level "Yin" may be formed between opposite ends of each of the capacitive elements C1 and C2 with respect to the voltage Vin. In the case of the charge pump 100a included in the N-th stage, since a level of a voltage provided as an input is "Yin+(N−1)*Vp", a voltage of level "Yin+(N−1)*Vp" may be formed between opposite ends of each of the capacitive elements C1 and C2.

Accordingly, in the case where "N" is great (i.e., in the case where the semiconductor chip 300 includes a lot of stages), a voltage of a high level may be formed between opposite ends of each of the capacitive elements C1 and C2. The designer may use sufficiently thick capacitors for the purpose of implementing the capacitive elements C1 and C2 tolerating a voltage of a high level.

In the case where one stage includes one charge pump 100a, one stage may include two thick capacitors corresponding to the capacitive elements C1 and C2. Accordingly, "2*N" thick capacitors 310 to 330 may be positioned on the semiconductor chip 300 including "N" stages. In the case where the area of each of the capacitors 310 to 330 is "Y", the capacitors 310 to 330 may be positioned on the area of "2*Y*N".

Figure 15:
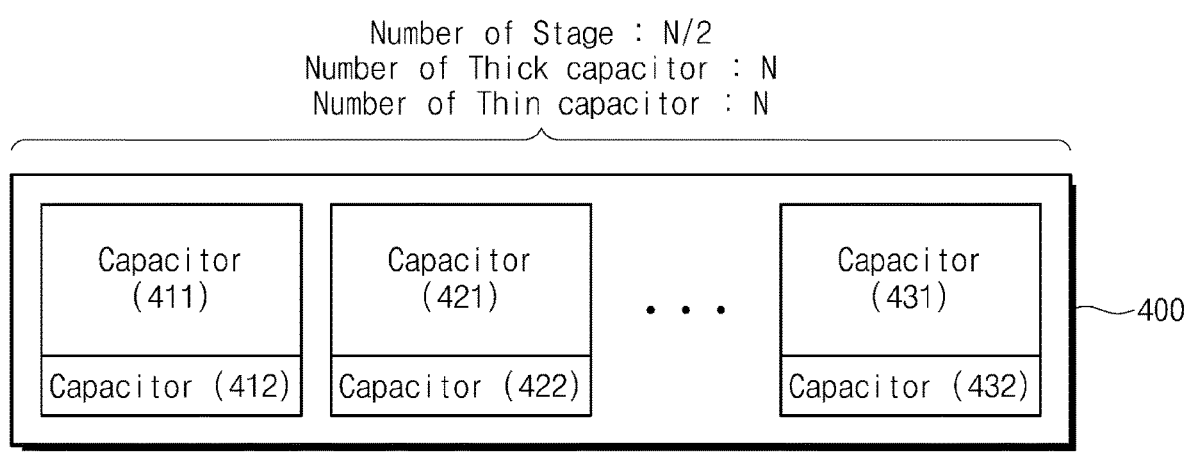
FIG. 15 is a block diagram illustrating an exemplary semiconductor chip including a charge pump of FIG. 4.

FIG. 15 is a block diagram illustrating an exemplary semiconductor chip including a charge pump of FIG. 4.

The charge pump 100b of FIG. 4 may output the voltage Vout of level "Vin+2*VDD" based on the voltage Vin. Accordingly, in the case where each of "N/2" stages connected in series includes one charge pump 100b, "Vp" (i.e., a level increased by one stage) of FIG. 13 corresponding to a semiconductor chip 400 may be "2*VDD". Referring to the operations of the semiconductor chip 200 described with reference to FIG. 13, the semiconductor chip 400 may output a voltage of "Yin+N*VDD" based on the voltage Vin.

As described with reference to FIG. 14, the semiconductor chip 300 of FIG. 14 including "N" stages connected in series may also output a voltage of "Yin+2*VDD" based on the voltage Vin. Accordingly, a level of a voltage output from the semiconductor chip 300 of FIG. 14 based on the voltage Vin and a level of a voltage output from the semiconductor chip 400 of FIG. 15 based on the voltage Vin may be identical to each other as "Vin+N*VDD".

Referring to FIG. 15, the semiconductor chip 400 may include capacitors 411 to 431 and capacitors 412 to 432. The capacitors 411 to 431 may correspond to the capacitive elements C11 and C21, and the capacitors 412 to 432 may correspond to the capacitive elements C12 and C22. For better understanding, only the capacitors 411 to 431 and 412 to 432 corresponding to the capacitive elements C11 and C21 and the capacitive elements C12 and C22 are illustrated in FIG. 15, but it may be understood that the semiconductor chip 400 may further include any other components for constituting the charge pump 100b.

As described with reference to FIGS. 7 and 10, a voltage of level "VDD" may be formed between opposite ends of each of the capacitive elements C12 and C22. Accordingly, a voltage of level "VDD" may be formed between opposite ends of each of the capacitive elements C12 and C22, regardless of a stage. In contrast, as in the description given with reference to the capacitive elements C1 and C2 in FIG. 14, as the charge pump 100b is included in a high stage, a voltage of a higher level may be formed between opposite ends of each of the capacitive elements C11 and C21. Accordingly, the level of the voltage across each of the capacitive elements C11 and C21 may be higher than a level of a voltage across each of the capacitive elements C12 and C22.

Accordingly, the designer may implement the capacitive elements C11 and C21 by using the thick capacitors 411 to 431 (e.g., capacitors similar to the capacitors 310 to 330 of FIG. 14). The designer may implement the capacitive elements C12 and C22 by using the capacitors 412 to 432 thinner than the capacitors 411 to 431 for implementing the capacitive elements C11 and C21. The area of each of the capacitors 412 to 432 may be smaller than the area of each of the capacitors 411 to 431.

For example, in the case where one stage includes one charge pump 100b, one stage may include two thick capacitors corresponding to the capacitive elements C11 and C21 and two thin capacitors corresponding to the capacitive elements C12 and C22. Accordingly, "N" thick capacitors and "N" thin capacitors may be positioned on the semiconductor chip 400 including "N/2" stages.

By comparing the semiconductor chip 300 (including "2*N" thick capacitors) of FIG. 14 and the semiconductor chip 400 (including "N" thick capacitors and "N" thin capacitors) of FIG. 15, the area of each of the capacitors 411 to 431 and 412 to 432 included in the semiconductor chip 400 may be smaller than the area of each of the capacitors 310 to 330 included in the semiconductor chip 300.

In detail, in the case where the area of each of the thick capacitors 411 to 431 and the area of each of the thick capacitors 310 to 330 is identically "Y" and the area of each of the capacitors 412 to 432 is "Y/D" (with "D" being a real number greater than "1"), the area of each of the capacitors 411 to 431 and 412 to 432 positioned on the semiconductor chip 400 may be "Y*(N+N/D)". The area "Y*(N+N/D)" of each of the capacitors 411 to 431 and 412 to 432 may be smaller than the area "2*N*Y" of the capacitors 310 to 330.

Accordingly, the size of the semiconductor chip 400 may be smaller than the size of the semiconductor chip 300. The designer may design and manufacture the semiconductor chip 400 having a small size while having performance similar to performance of the semiconductor chip 300, by using the charge pump 100b instead of the charge pump 100a.

Also, since the number of active elements (e.g., switches) for constituting "N" charge pumps 100a included in the semiconductor chip 300 is more than the number of active elements for constituting "N/2" charge pumps 100b included in the semiconductor chip 400, power consumption of the semiconductor chip 400 may be smaller than power consumption of the semiconductor chip 300. Accordingly, the designer may design and manufacture the semiconductor chip 400 consuming a small power while having performance similar to performance of the semiconductor chip 300, by using the charge pump 100b instead of the charge pump 100a.

Figure 16:
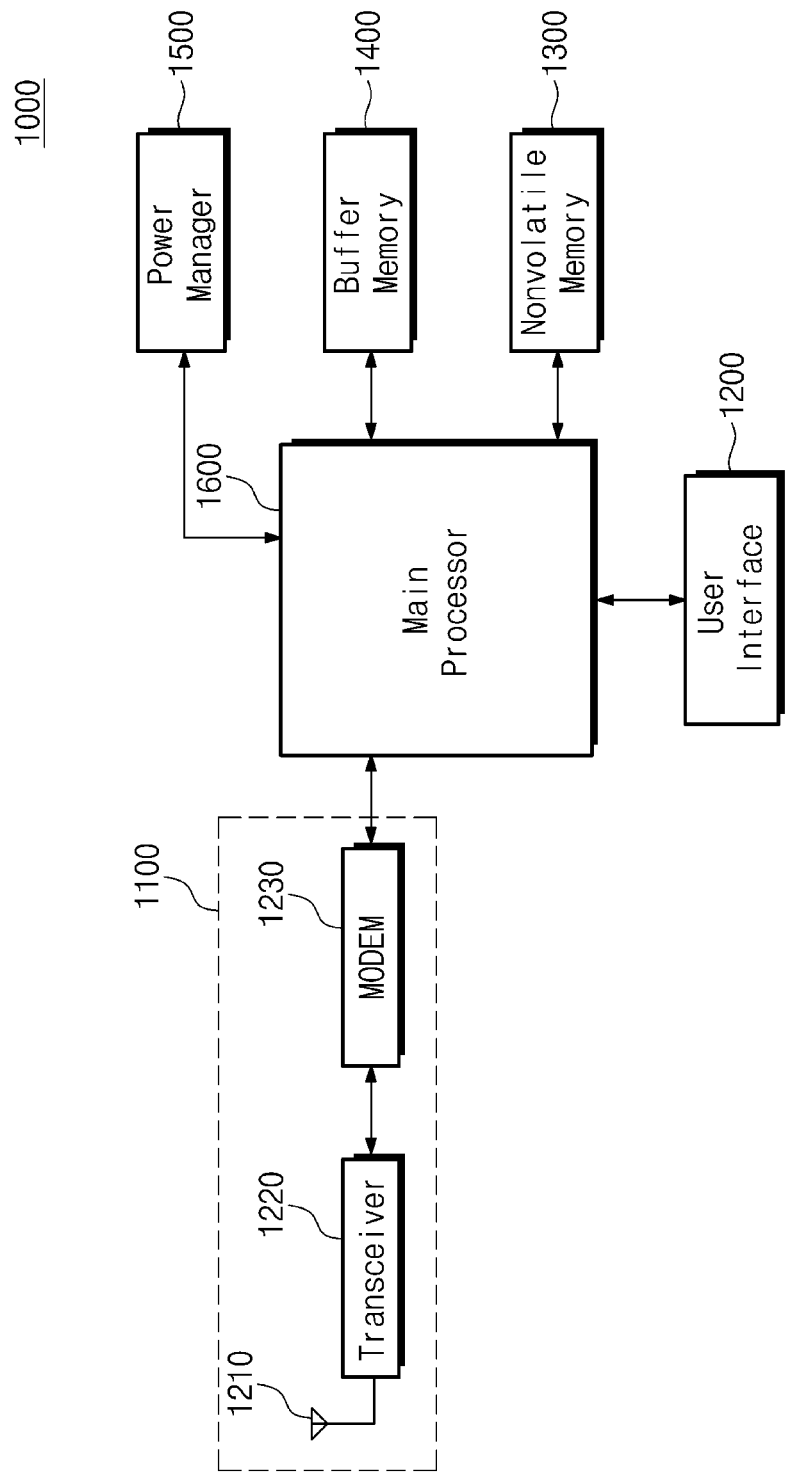
FIG. 16 is a block diagram illustrating an exemplary electronic device including a charge pump of FIG. 4.

FIG. 16 is a block diagram illustrating an exemplary electronic device including a charge pump of FIG. 4.

Referring to FIG. 16, an electronic device 1000 may include a communication block 1100, a user interface 1200, a nonvolatile memory 1300, a buffer memory 1400, a power manager 1500, and a main processor 1600. However, components of the electronic device 1000 are not limited to the embodiment of FIG. 16. The electronic device 1000 may not include one or more of the components illustrated in FIG. 16 or may further include at least one component not illustrated in FIG. 16.

For example, each of the components of the electronic device 1000 may include an electronic circuit, such as a charge pump, for the purpose of generating a voltage necessary for an operation. For example, each of the communication block 1100, the user interface 1200, the nonvolatile memory 1300, the buffer memory 1400, the power manager 1500, and the main processor 1600 may include at least one of the charge pump 100b of FIG. 4 and the semiconductor chip 400 of FIG. 15.

The communication block 1100 may include an antenna 1210, a transceiver 1220, and a modulator/demodulator (MODEM) 1230. The communication block 1100 may exchange signals with an external device/system through an antenna 1210. For example, the transceiver 1220 and the MODEM 1230 of the communication block 1100 may process signals exchanged with the external device/system in compliance with a wireless communication protocol such as long term evolution (LTE), worldwide interoperability for microwave access (WiMax), global system for mobile communication (GSM), code division multiple access (CDMA), Bluetooth, near field communication (NFC), wireless fidelity (Wi-Fi), or radio frequency identification (RFID).

The buffer memory 1400 may store data which are used in an operation of the electronic device 1000. For example, the buffer memory 1400 may temporarily store data processed or to be processed by the main processor 1600. For example, the buffer memory 1400 may include a volatile memory, such as a static random access memory (SRAM), a dynamic RAM (DRAM), or a synchronous DRAM (SDRAM), and/or a nonvolatile memory, such as a flash memory, a phase-change RAM (PRAM), a magneto-resistive RAM (MRAM), a resistive RAM (ReRAM), or a ferro-electric RAM (FRAM).

The nonvolatile memory 1300 may store data regardless of power supply. For example, the nonvolatile memory 1300 may include at least one of various nonvolatile memories such as a flash memory, a PRAM, an MRAM, a ReRAM, and a FRAM. For example, the nonvolatile memory 1300 may include a removable memory such as a hard disk drive (HDD), a solid state drive (SSD), or a secure digital (SD) card, and/or an embedded memory such as an embedded multimedia card (eMMC).

The buffer memory 1400 and the nonvolatile memory 1300 may generate voltages having levels required to read or write data. For example, the buffer memory 1400 and the nonvolatile memory 1300 may include at least one of the charge pump 100b of FIG. 4 and the semiconductor chip 400 of FIG. 15 for the purpose of generating various levels of voltages. For example, the charge pump 100b of FIG. 4 and the semiconductor chip 400 of FIG. 15 may be configured to generate a pass voltage for reading data, a program voltage for writing data, and an erase voltage for erasing data.

The user interface 1200 may arbitrate communication between a user and the electronic device 1000. For example, the user may input commands to the electronic device 1000 through the user interface 1200. For example, the electronic device 1000 may provide information generated by the main processor 1600 to the user through the user interface 1200.

The main processor 1600 may control overall operations of the electronic device 1000. The main processor 1600 may control/manage operations of components of the electronic device 1000. For example, the main processor 1600 may access the buffer memory 1400 and the nonvolatile memory 1300 to write data to the buffer memory 1400 and the nonvolatile memory 1300 or to read data stored in the buffer memory 1400 and the nonvolatile memory 1300. For example, the main processor 1600 may be implemented with at least one of a general-purpose processor, a special-purpose processor, or an application processor.

The power manager 1500 may power the components of the electronic device 1000. For example, the power manager 1500 may appropriately convert a power received from a battery and/or an external power source and may transfer the converted power to the components of the electronic device 1000. For example, the power manager 1500 may include at least one of the charge pump 100b of FIG. 4 and the semiconductor chip 400 of FIG. 15 for the purpose of generating a voltage required by the electronic device 1000.

Figure 17:
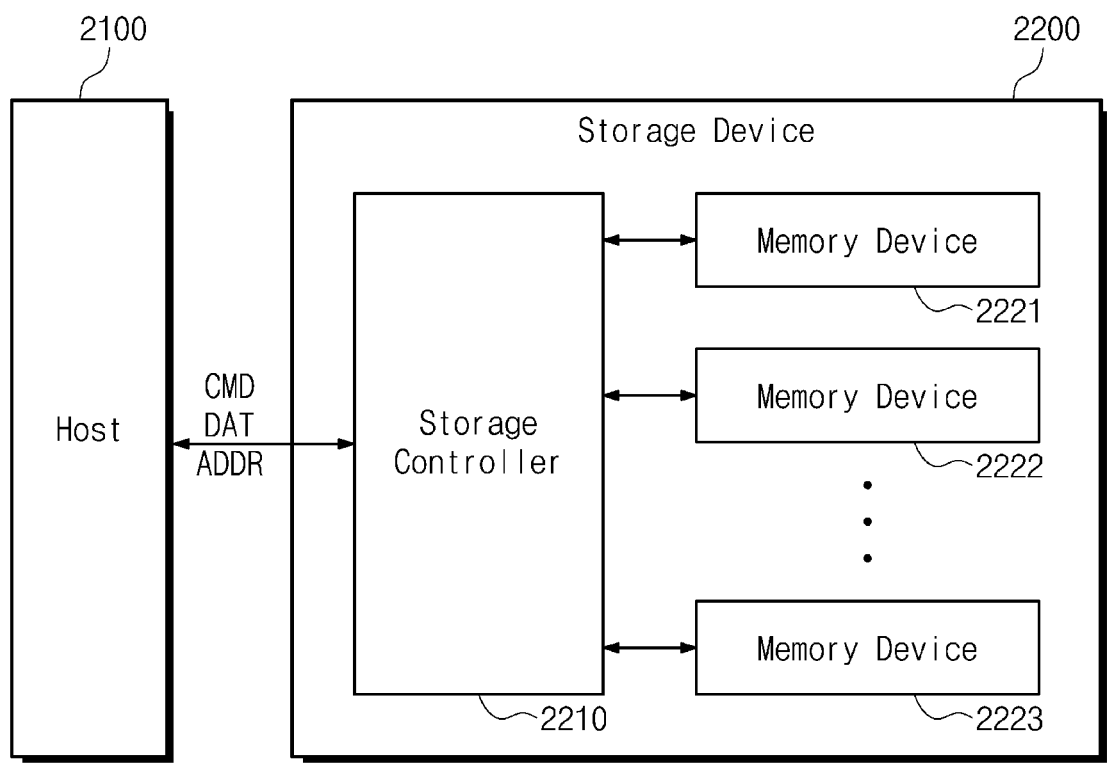
FIG. 17 is a block diagram illustrating an exemplary electronic device including a charge pump of FIG. 4.

FIG. 17 is a block diagram illustrating an exemplary electronic device including a charge pump of FIG. 4.

An electronic device 2000 may include a host 2100 and a storage device 2200. The storage device 2200 may include a storage controller 2210 and memory devices 2221 to 2223. As described with reference to FIG. 16, the main processor 1600 may access the buffer memory 1400 and the nonvolatile memory 1300 for the purpose of storing data or reading the stored data. In an example of FIG. 17, the host 2100 may be an object which may access the storage device 2200 through the storage controller 2210. For example, the main processor 1600 may operate as the host 2100. The storage device 2200 may be configured to store data or output the stored data. For example, the buffer memory 1400 or the nonvolatile memory 1300 of FIG. 16 may operate as the storage device 2200.

The host 2100 may exchange data DAT with the storage device 2200. The storage device 2200 may provide a storage service to the host 2100 in response to a command CMD received from the host 2100. The host 2100 may exchange an address ADDR associated with memory regions in the memory devices 2221 to 2223 with the storage device 2200.

For example, the host 2100 may provide the command CMD including a write request and the data DAT including write data to the storage device 2200. The storage device 2200 may store requested write data to the memory devices 2221 to 2223 in response to a write command. For example, the host 2100 may provide the command CMD including a read request to the storage device 2200. The storage device 2200 may output requested read data DAT from the memory devices 2221 to 2223 to the host 2100 in response to a read command.

Each of the memory devices 2221 to 2223 may store or output data requested by the host 2100. Each of the memory devices 2221 to 2223 may include a memory region for storing data. Write data may be stored to a memory region directed by the address ADDR, and read data may be output from a memory region directed by the address ADDR.

Each of the memory devices 2221 to 2223 may generate various levels of voltages necessary to store write data, to read "read data", or to erase stored data. The memory devices 2221 to 2223 may include at least one of the charge pump 100b of FIG. 4 and the semiconductor chip 400 of FIG. 15 for the purpose of generating voltages necessary for operations. The memory devices 2221 to 2223 may perform operations corresponding to the command CMD of the host 2100 by applying the generated voltages to the respective memory regions.

A storage controller 2210 may control overall operations of the storage device 2200. The storage controller 2210 may control the memory devices 2221 to 2223 to allow the memory devices 2221 to 2223 to store or output data.

Figure 18:
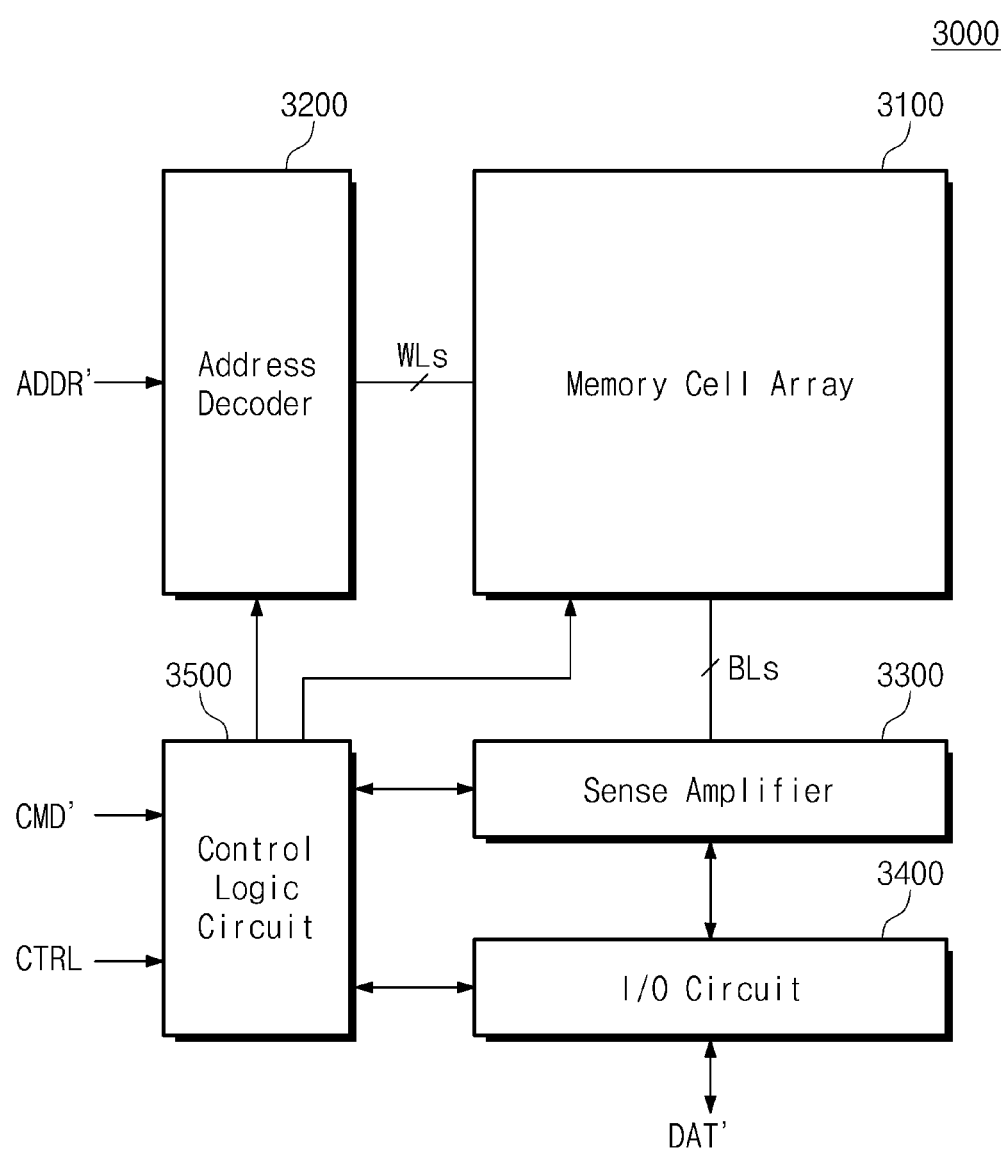
FIG. 18 is a block diagram illustrating an exemplary memory device including a charge pump of FIG. 4.

FIG. 18 is a block diagram illustrating an exemplary memory device including a charge pump of FIG. 4.

Each of the memory devices 2221 to 2223 of FIG. 17 may be a memory device 3000 of FIG. 18 The memory device 3000 may include a memory cell array 3100, an address decoder 3200, a sense amplifier 3300, an input/output circuit 3400, and a control logic circuit 3500.

The memory cell array 3100 may include a plurality of memory cells. The plurality of memory cells may be connected with a plurality of word lines WLs and a plurality of bit lines BLs. Data DAT' received through the input/output circuit 3400 may be stored to a plurality of memory cells.

The address decoder 3200 may be connected with the memory cell array 3100 through word lines WLs. The address decoder 3200 may receive an address ADDR' from a storage controller 2210 and may decode the received address ADDR'. The address decoder 3200 may drive the word lines WLs based on the decoded address ADDR'. For example, the address decoder 3200 may apply a program voltage to a word line connected to a particular memory cell for the purpose of programming the particular memory cell. Alternatively, the address decoder 3200 may apply a pass voltage to word lines connected to unselected memory cells for the purpose of reading the particular memory cell.

The sense amplifier 3300 may be connected with the memory cell array 3100 through bit lines BLs. The sense amplifier 3300 may sense data to be read from the memory cell array 3100. The input/output circuit 3400 may manage data input/output of the memory device 3000 such that data DAT' are exchanged between the storage controller 2210 and the memory cell array 3100.

The control logic circuit 3500 may receive a command CMD' and a control signal CTRL from the storage controller 2210. The control logic circuit 3500 may control the address decoder 3200, the sense amplifier 3300, and the input/output circuit 3400 based on the received signals.

The control logic circuit 3500 may generate various levels of voltages to be used to read, write, or erase data at the memory cell array 3100. For example, the control logic circuit 3500 may include a charge pump for the purpose of generating the pass voltage, the program voltage, and the erase voltage. The control logic circuit 3500 may output the program voltage and the pass voltage to the address decoder 3200 and may output the erase voltage to the memory cell array 3100.

According to an embodiment of the disclosure, an electronic circuit including a charge pump configured to converting a voltage while occupying the small area and consuming a small power may be provided.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to exemplary embodiments thereof, it will be apparent to those of ordinary skill in the art that various changes and modifications may be made thereto without departing from the spirit and scope of the disclosure as set forth in the following claims.

What is claimed is:

1. An electronic circuit comprising:
   a first switch circuit configured to transfer a first driving voltage to a first node based on a first clock;

a second switch circuit configured to transfer a second driving voltage to a second node based on the first driving voltage of the first node;

a pumping circuit configured to output a pumping voltage having a level corresponding to a sum of a level of the second driving voltage and a first operation level of a second clock, based on the second driving voltage of the second node and the first operation level; and a main charge pump configured to convert an input voltage based on the pumping voltage.

2. The electronic circuit of claim 1, wherein the first switch circuit is further configured to transfer the first driving voltage to the first node in response to the first operation level of the first clock.

3. The electronic circuit of claim 1, wherein the main charge pump is further configured to output a voltage having a level corresponding to a sum of a level of the input voltage and the level of the pumping voltage, based on a third clock.

4. The electronic circuit of claim 1, wherein the pumping circuit is further configured to transfer, to the first node, a voltage formed at the second node by the second driving voltage of the second node and the second clock.

5. The electronic circuit of claim 4, wherein:
the pumping circuit is further configured to output the voltage formed at the second node in response to a second operation level of the first clock, and
the first clock and the second clock periodically have the first operation level and the second operation level complementary to the first operation level.

6. The electronic circuit of claim 1, wherein the pumping circuit further includes a first capacitive element configured to maintain the input voltage and to transfer the pumping voltage to the main charge pump, between the first node and the main charge pump.

7. The electronic circuit of claim 6, wherein the pumping circuit further includes a second capacitive element configured to transfer the second clock to the second node and to maintain the transferred second driving voltage at the second node.

8. The electronic circuit of claim 7, wherein a size of the first capacitive element is larger than a size of the second capacitive element.

9. An electronic circuit comprising:
a first sub charge pump configured to output a first pumping voltage of a level corresponding to a sum of a level of a driving voltage and a level of a first operation level, based on the driving voltage received in a first time interval and the first operation level of a first clock received in a second time interval after the first time interval;
a second sub charge pump configured to output a second pumping voltage of a level corresponding to a sum of the level of the driving voltage and the first operation level, based on the driving voltage received in the second time interval and the first operation level of a second clock received in a third time interval after the second time interval; and
a main charge pump configured to convert an input voltage based on the first pumping voltage and the second pumping voltage.

10. The electronic circuit of claim 9, wherein the first sub charge pump is further configured to output the first pumping voltage in response to a second operation level of the second clock, and the second sub charge pump is further configured to output the second pumping voltage in response to the second operation level of the first clock.

11. The electronic circuit of claim 9, wherein the main charge pump is further configured to sequentially output a first conversion voltage having a level corresponding to a sum of a level of the input voltage and the level of the first pumping voltage, and a second conversion voltage having a level corresponding to a sum of the level of the input voltage and the level of the second pumping voltage.

12. The electronic circuit of claim 11, wherein the main charge pump is further configured to:
output the first conversion voltage in response to a second operation level of a third clock; and
output the second conversion voltage in response to the second operation level of a fourth clock.

13. The electronic circuit of claim 12, wherein the third clock has the second operation level during a third time interval included in the first time interval, and the fourth clock has the second operation level during a fourth time interval included in the second time interval.

14. The electronic circuit of claim 9, wherein the main charge pump is further configured to:
transfer the input voltage to a first node between the first sub charge pump and the main charge pump in response to the first operation level of the second clock in the first time interval; and
transfer the input voltage to a second node between the second sub charge pump and the main charge pump in response to the first operation level of the first clock in the second time interval.

15. The electronic circuit of claim 14, wherein the input voltage transferred to the first node is maintained on the first node during the first time interval, and the input voltage transferred to the second node is maintained on the second node during the second time interval.

16. An electronic circuit comprising:
a first capacitive element configured to maintain a first driving voltage transferred to a first node based on a first operation level of a first clock during a first time interval and to transfer a second clock of the first operation level to the first node in a second time interval after the first time interval;
a second capacitive element configured to transfer a voltage having a level corresponding to a sum of the first operation level and a level of the first driving voltage based on the first driving voltage maintained at the first node and the second clock transferred to the first node, during the second time interval; and
a main charge pump configured to convert an input voltage based on the voltage transferred from the second capacitive element, wherein
a size of the second capacitive element is larger than a size of the first capacitive element.

17. The electronic circuit of claim 16, wherein the second capacitive element is further configured to maintain the input voltage during the second time interval.

18. The electronic circuit of claim 16, wherein the main charge pump is further configured to output a voltage having a level corresponding to a sum of a level of the input voltage and a level of the voltage transferred from the second capacitive element, during a third time interval included in the second time interval.

19. The electronic circuit of claim 16, further comprising a switch circuit configured to transfer a voltage formed at the first node by the first driving voltage and the second clock, to a second node between the first capacitive element and the second capacitive element in response to a second operation level of the first clock.

20. The electronic circuit of claim 19, further comprising:
a second switch circuit configured to transfer a second driving voltage to the second node in response to the first operation level of the first clock, in the first time interval,
wherein the first driving voltage is transferred to the first node in response to the second driving voltage transferred to the second node.

* * * * *